United States Patent
Park et al.

(10) Patent No.: US 10,623,112 B2
(45) Date of Patent: Apr. 14, 2020

(54) LOW POWER MAGNETIC FIELD BODY AREA NETWORK

(71) Applicant: The Regents of the University of California, Oakland, CA (US)

(72) Inventors: Jiwoong Park, La Jolla, CA (US); Patrick Mercier, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 15/752,817

(22) PCT Filed: Aug. 23, 2016

(86) PCT No.: PCT/US2016/048200
§ 371 (c)(1),
(2) Date: Feb. 14, 2018

(87) PCT Pub. No.: WO2017/035143
PCT Pub. Date: Mar. 2, 2017

(65) Prior Publication Data
US 2018/0241483 A1 Aug. 23, 2018

Related U.S. Application Data

(60) Provisional application No. 62/208,881, filed on Aug. 24, 2015.

(51) Int. Cl.
*H04B 13/00* (2006.01)
*H04W 4/80* (2018.01)
(Continued)

(52) U.S. Cl.
CPC ......... *H04B 13/005* (2013.01); *H04B 5/0093* (2013.01); *H04W 4/80* (2018.02);
(Continued)

(58) Field of Classification Search
CPC . H02J 7/025; H02J 50/10; H02J 50/12; H04B 5/0031; H04B 5/0075–0093
(Continued)

(56) References Cited

U.S. PATENT DOCUMENTS 5,907,522 A * 5/1999 Teodoridis ............. H01Q 1/273
368/10
6,114,832 A * 9/2000 Lappi ................... A61B 5/0002
320/108
(Continued)

OTHER PUBLICATIONS

Bae et al., "The Signal Transmission Mechanism on the Surface of Human Body for Body Channel Communication", IEEE Transactions on Microwave Theory and Techniques, vol. 60, No. 3, pp. 582-593, Mar. 2012.
(Continued)

*Primary Examiner* — Edward F Urban
*Assistant Examiner* — Rui M Hu
(74) *Attorney, Agent, or Firm* — Greer, Burns & Crain, Ltd.; Steven P. Fallon

(57) ABSTRACT

The invention provides a body area network. A first coil is configured to be worn on a body portion of a human, and the first coil is configured and positioned to use a body leveraged magnetic field. A transmitter drives the first coil to generate a magnetic body field through the first magnetic coil at a frequency selected such that the body leveraged magnetic field simultaneously includes near-field and far-field components and the far-field components are enhanced by a high dielectric constant of bodily tissue. A second coil couples to the signal transmitted via the first coil, and the second coil is configured and positioned to receive both of the near- and far-field components. A receiver receives the signal from the second coil. A method for establishing network communications using the human body as a magnetic field drives a transmitter coil to generate magnetic
(Continued)

near- and far-field components that include the human body as a medium to propagate the magnetic near- and far-field components, wherein the driving is at a frequency and transmission power selected to enhance far-field magnetic flux density via guiding at a boundary of the human body.

20 Claims, 22 Drawing Sheets

(51) Int. Cl.
　　 H04B 5/00　　(2006.01)
　　 H03H 7/38　　(2006.01)
(52) U.S. Cl.
　　 CPC ............... H03H 7/38 (2013.01); Y02D 70/10 (2018.01); Y02D 70/1262 (2018.01); Y02D 70/142 (2018.01); Y02D 70/144 (2018.01); Y02D 70/162 (2018.01); Y02D 70/166 (2018.01); Y02D 70/20 (2018.01); Y02D 70/26 (2018.01); Y02D 70/42 (2018.01)
(58) Field of Classification Search
　　 USPC .............................................. 455/41.1–41.3
　　 See application file for complete search history.

(56) References Cited

U.S. PATENT DOCUMENTS

| | | | |
|---|---|---|---|
| 6,424,820 B1* | 7/2002 | Burdick | H04B 5/0081 455/132 |
| 7,933,554 B2* | 4/2011 | Hoyt | H04B 5/02 310/268 |
| 8,244,187 B2* | 8/2012 | Yoo | H04B 5/00 455/41.1 |
| 9,671,213 B2* | 6/2017 | Ellsworth | A63F 13/00 |
| 9,998,182 B2* | 6/2018 | Huang | H04B 5/0081 |
| 10,009,069 B2* | 6/2018 | Kerselaers | H04B 5/02 |
| 10,014,578 B2* | 7/2018 | Kerselaers | H04B 13/005 |
| 2002/0154518 A1 | 10/2002 | Elferich et al. | |
| 2004/0171355 A1* | 9/2004 | Yu | A61N 1/3787 455/78 |
| 2006/0084380 A1* | 4/2006 | Hoyt | H04B 5/02 455/41.1 |
| 2006/0224048 A1 | 10/2006 | Devaul et al. | |
| 2008/0129621 A1* | 6/2008 | Koshiji | A61B 5/0002 343/718 |
| 2008/0238679 A1* | 10/2008 | Rofougaran | G06K 7/0008 340/572.2 |
| 2008/0284599 A1* | 11/2008 | Zdeblick | A61B 5/0031 340/572.1 |
| 2008/0306359 A1* | 12/2008 | Zdeblick | A61B 5/0028 600/302 |
| 2009/0215391 A1* | 8/2009 | Yoo | H04B 5/00 455/41.1 |
| 2011/0101788 A1* | 5/2011 | Sun | H01F 38/14 307/104 |
| 2011/0218402 A1* | 9/2011 | Sato | A61B 1/00016 600/160 |
| 2011/0285212 A1* | 11/2011 | Higuma | H02J 5/005 307/104 |
| 2012/0153740 A1* | 6/2012 | Soar | F41H 1/02 307/104 |
| 2012/0187767 A1* | 7/2012 | Kanno | H02J 50/40 307/82 |
| 2012/0212074 A1* | 8/2012 | Uchida | H02J 50/12 307/104 |
| 2012/0228954 A1 | 9/2012 | Kesler et al. | |
| 2013/0018439 A1* | 1/2013 | Chow | A61N 1/3787 607/60 |
| 2013/0062962 A1* | 3/2013 | Xue | H02J 5/005 307/104 |
| 2013/0148828 A1* | 6/2013 | Fort | H04R 25/30 381/312 |
| 2013/0267173 A1* | 10/2013 | Ling | H04B 5/00 455/41.1 |
| 2013/0278470 A1* | 10/2013 | Kataoka | H01Q 1/273 343/718 |
| 2014/0062212 A1* | 3/2014 | Sun | H01F 38/14 307/104 |
| 2014/0139041 A1 | 5/2014 | Bohori et al. | |
| 2014/0213184 A1 | 7/2014 | Matsubara | |
| 2015/0318932 A1* | 11/2015 | Kerselaers | H04R 25/55 381/315 |
| 2015/0319545 A1* | 11/2015 | Kerselaers | H04R 25/60 381/315 |
| 2015/0326028 A1* | 11/2015 | Suzuki | H02J 7/025 307/104 |
| 2016/0181858 A1* | 6/2016 | Satyamoorthy | H02J 7/0042 307/104 |
| 2016/0268848 A1* | 9/2016 | Nalbant | H02J 7/025 |
| 2017/0222493 A1* | 8/2017 | Oki | H02J 50/90 |
| 2017/0346345 A1* | 11/2017 | Kurs | H02J 50/12 |
| 2018/0269564 A1* | 9/2018 | Venkatasubramanian | A61N 1/375 |

OTHER PUBLICATIONS

Cannon et al., "Magnetic Resonant Coupling as a Potential Means for Wireless Power Transfer to Multiple Small Receivers", IEEE Transactions on Power Electronics, vol. 24, No. 7, pp. 1819-1825, Jul. 2009.

Cho et al., "The Human Body Characteristics as a Signal Transmission Medium for Intrabody Communication", IEEE Transactions on Microwave Theory and Techniques, vol. 55, No. 5, pp. 1080-1086, May 2007.

Fort et al., "Ultra-Wideband Channel Model for Communication Around the Human Body", IEEE Journal on Selected Areas in Communications, vol. 24, No. 4, pp. 927-933, Apr. 2006.

Hwang et al., "Empirical Channel Model for Human Body Communication", IEEE Antennas and Wireless Propagation Letters, vol. 14, pp. 694-697, 2015.

Kibret et al., "Investigation of Galvanic-Coupled Intrabody Communication Using the Human Body Circuit Model", IEEE Journal of Biomedical and Health Informatics, vol. 18, No. 4, pp. 1196-1206, Jul. 2014.

Mercier and Chandrakasan, "A Supply-Rail-Coupled eTextiles Transceiver for Body-Area Networks", IEEE Journal of Solid-State Circuits, vol. 46, No. 6, pp. 1284-1295, Jun. 2011.

Song et al., "Low Power Wearable Audio Player Using Human Body Communications", 2006 10th IEEE International Symposium on Wearable Computers, pp. 125-126, 2006.

Shane Thomas, International Search Report for Application No. PCT/US2016/048200, dated Nov. 7, 2016.

Zimmerman, "Personal Area Networks (PAN): Near-Field Intra-Body Communication", M.S. Thesis, Massachusetts Institute of Technology, Cambridge, MA, 1995.

Gaede, Sebastian, European Search Report for Application No. PCT/US2016/048200, dated Feb. 28, 2019.

* cited by examiner

LOW POWER MAGNETIC FIELD BODY AREA NETWORK

PRIORITY CLAIM AND REFERENCE TO RELATED APPLICATION

The application claims priority under 35 U.S.C. § 119 and all applicable statutes and treaties from prior provisional application Ser. No. 62/208,881, which was filed Aug. 24, 2015.

FIELD

Example fields of the invention include network communications and body monitoring systems. Example body monitoring systems include body worn health sensing systems, activity trackers and body worn sports performance systems. Networks of the invention can provide communications for any wearable device that needs to wireless communicate information around the body (e.g., wearable sensors, activity trackers, smartwatches, EEG headsets, etc.) with ultra-low-power consumption.

BACKGROUND

Medical devices and wearable consumer products have fundamental anatomically-driven size constraints that necessitate small form factors. Since most patients and consumers desire long battery life, and battery volume is limited by anatomy, one of the only ways to increase lifetime is to reduce the power of the underlying circuits. Even when wireless communications are limited in distance or duration to save power, the energy budget of the wireless communication components of the device can still dominate the overall energy budget of a wearable device.

Most efforts have therefore focused on providing higher performance wireless circuits. Low power, high performance wearable circuits tend to use expensive components. Ultra-low power radio circuits for example are available from IMEC as custom circuit designs, but depend up leveraging very small node low-power CMOS transceivers, e.g. a 7 Gbps 60 GHz transceiver IC implemented in 40 nm low-power CMOS. The cost of such wireless transceivers can substantially raise the price of a wearable component, and there is still a desire for reduced cost, area and power consumption wireless communications to improve wearable medical and consumer body monitoring devices.

One approach that turned away from merely improving the circuit efficient and power performance of conventional transceivers is an approach that uses the human body as a communication channel for electric fields via galvanic coupling. An e-textile approach was developed by one of the inventors and a colleague. See, P. P. Mercier and A. P. Chandrakasan, "A Supply-Rail-Coupled eTextiles Transceiver for Body-Area Networks," *IEEE J. Solid-State Circuits*, vol. 46, no. 6, pp. 1284-1295, June 2011. Others have also used the human body as a communication channel for electric fields. Song, S. Lee, N. Cho, and H. Yoo, "Low Power Wearable Audio Player Using Human Body Communications," in 2006 10*th IEEE International Symposium on Wearable Computers*, 2006, pp. 125-126. The eTextiles offers the lowest power consumption due to inherently low path loss, but leveraged dedicated clothing, which may not be practical or desirable in many applications.

Galvanic coupling typically employs two electrode pairs, which can be attached on the skin as the transmitter (TX) and receiver (RX) nodes. At the TX node, an electrical signal is applied differentially, inducing small currents that propagate across the entire body, some of which can be sensed by the RX. Thus, galvanic coupling acts much like a distributed wired connection across the body, and can thereby achieve a high level of security/privacy and good interference resiliency.

Another approach relies upon electric field human body communication and can be referred to as eHBC. J. H. Hwang, T. W. Kang, S. O. Park, and Y. T. Kim, "Empirical Channel Model for Human Body Communication," *IEEE Antennas Wirel. Propag. Lett.*, vol. 14, pp. 694-697, 2015. Such systems can have lower path loss compared to conventional far-field radios (e.g., Bluetooth, WiFi, Zigbee, LTE, etc.), and further benefit from lower-complexity multiuser access and security requirements due to limited broadcasting of energy. However, the improvement in path loss is not always large, especially when small, battery-powered devices are used, and thus the advantages of eHBC over conventional radios is still unclear. Additionally, galvanic eHBC systems have limited dynamic path loss degradation due to movement, and can be used to communicate with implants. However, due to the low conductivity of tissues found in the human body, galvanic eHBC has relatively large path loss compared to other approaches. B. Kibret, M. Seyedi, D. T. H. Lai, and M. Faulkner, "Investigation of galvanic-coupled intrabody communication using the human body circuit model," *IEEE J. Biomed. Heal. informatics*, vol. 18, no. 4, pp. 1196-206, July 2014.

Other systems capacitively couple to the body. Capacitive eHBC systems also require two electrode pairs to generate differential signals around the human body, but their physical configurations are slightly different. With a capacitive couple, only one electrode should be directly placed on (or near) the skin to produce electric fields within the human body, while the other electrode should be placed facing outwards in order to capacitively couple to the environment. See, e.g., T. G. Zimmerman, "Personal area networks (PAN): Near-field intra-body communication," M. S. Thesis, Massachusetts Inst. Technol., Cambridge, Mass., 1995. According to other researchers, this coupling mechanism can be modeled as distributed RC circuits if the operation frequency is low enough for electrostatic analysis. N. Cho, J. Yoo, S. J. Song, J. Lee, S. Jeon, and H. J. Yoo, "The human body characteristics as a signal transmission medium for intrabody communication," *IEEE Trans. Microw. Theory Tech.*, vol. 55, no. 5, pp. 1080-1085, 2007. However, as the frequency is scaled above tens of MHz, the power radiated by electrodes increases, and others have proposed a wave propagation model operating on the surface of human body. J. Bae, H. Cho, K. Song, H. Lee, and H.-J. Yoo, "The Signal Transmission Mechanism on the Surface of Human Body for Body Channel Communication," *IEEE Trans. Microw. Theory Tech.*, vol. 60, no. 3, pp. 582-593, March 2012. Such models have shown that capacitive coupling achieves a lower path loss than galvanic coupling.

However, the present inventors have recognized that capacitive eHBC systems suffer from a number of drawbacks. For example, they require large ground planes to increase environmental coupling and reduce path loss. This path loss also has high variability based on environmental conditions (and the availability of objects to couple to). Furthermore, since the IEEE established the 802.15.6 WBAN standard in 2012, eHBC has used 21 MHz as its operation frequency, yet capacitive coupling generally achieves the lowest path loss at higher frequencies. The present inventors have also identified that although capacitive eHBC can offer superior path loss compared to conventional far-field radiation, the variance caused by environmental effects and the poor conductivity of the human body further limit its utility.

SUMMARY OF THE INVENTION

An embodiment of the invention is a body area network. A first coil is configured to be worn on a body portion of a human, and the first coil is configured and positioned to use a body leveraged magnetic field. A transmitter drives the first coil to generate a magnetic body field through the first magnetic coil at a frequency selected such that the body leveraged magnetic field simultaneously includes near-field and far-field components and the far-field components are enhanced by a high dielectric constant of bodily tissue. A second coil couples to the signal transmitted via the first coil, and the second coil is configured and positioned to receive both of the near- and far-field components. A receiver receives the signal from the second coil.

An embodiment of the invention is a method for establishing network communications using the human body as a magnetic field. A transmitter coil is associated with a portion of a human body, the transmitter coil being configured to couple to a receiver coil in a frequency range that leverages frequency-dependent dielectric constants of biological tissues of the human body and thereby provide better physical far-field properties than air. The transmitter coil is driven to generate magnetic near- and far-field components that include the human body as a medium to propagate the magnetic near- and far-field components, wherein the driving is at a frequency and transmission power selected to enhance far-field magnetic flux density via guiding at a boundary of the human body. The transmitter and receiver coils are coupled via the magnetic near- and far-fields.

DETAILED DESCRIPTION OF THE PREFERRED EMBODIMENTS

Figure 1A:
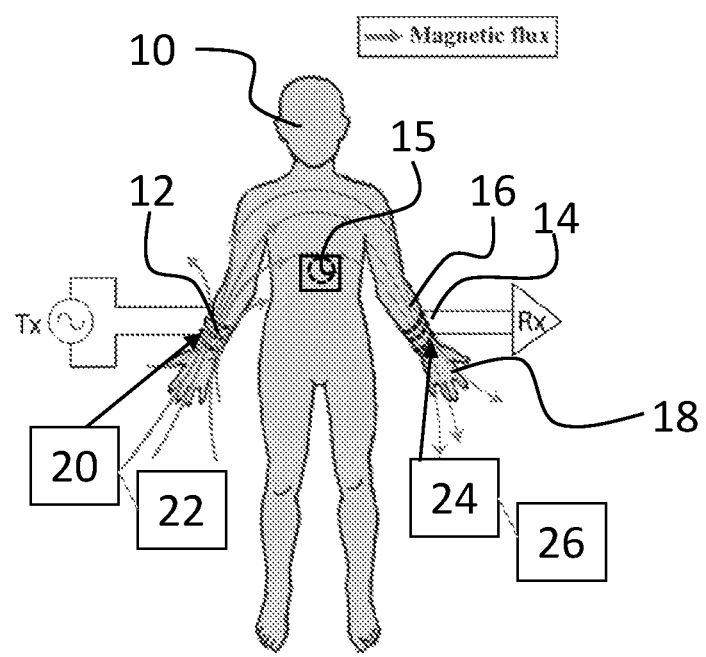
FIG. 1A illustrates a preferred embodiment body area network and network transmission system of the invention.

A preferred embodiment is low power body area network. The network is applicable, for example, to wearable health monitoring systems and consumer systems, such as sports performance monitoring systems. A network of the invention leverages a magnetic field as the network medium. The inventors have determined that the body is an exceptional medium for propagating magnetic fields. A preferred system of the invention includes a body leveraged magnetic field and sensors that sense a health signal in one area of the body (heart rate, EEG, etc.), or an activity signal, such as acceleration, distance traveled. The sensor transmits the sensed signal via the magnetic network. A receiver placed elsewhere on or proximate the body, e.g. a smart watch worn by a person, a smart phone carried by a person or a computer device with a receiver in the vicinity of the person, is able to sense the signals transmitted by the sensor via coils at transmit and receive ends of the magnetic field pathway. Receivers in the vicinity of a person can include a computer in a medical text or a station along a sport performance route, for example, equipped with a magnetic coil and receive matched to the mHBC transmitter coil and transmitter carried on the person.

The network and systems of the invention provide excellent communications, and compare favorably to more traditional electric field communication systems. As another advantage, the magnetic field communication medium of the invention falls off very rapidly outside of the body. In preferred embodiments, the maximum range is a few meters, i.e., ~2-4 meters. This can act as a privacy function for a user that lends more privacy to the user than electrical based systems. The inventors have determined that the present magnetic field system can be more reliable than E field or other wireless systems.

Systems of the invention use transmission and reception coils, one or more of which being configured to wrap around a portion of the body or configured to be parallel to a portion of a body such as a patch with coils that are substantially parallel to a portion of a body that carries the patch, such as an arm, wrist, head, the chest etc. Devices that naturally wrap-around anatomy (e.g., smartwatches and headbands) can naturally leverage the preferred mHBC technique for a wide range of wearable and medical applications. The coils can be packaged in commonly worn items such as wrist bands, watch bands, arm bands that hold devices, headbands, leg bands, or apparel. The coils are driven to produce a magnetic field and a resonantly coupled to each other to act as a transmitter and receiver coil to establish the body area network. Preferred embodiments have been demonstrated via both simulation and measurements that show that resonantly coupled magnetic coils of the invention can achieve at least 20 dB lower path loss across the human body than both far-field radios and eHBC systems. Energy stays primarily in the magnetic near-field. The permeability of biological tissue is low. Thus, propagation and broadcasting is limited, but the path loss is low. Thus, the preferred mHBC technique can enable low-power transceivers that retain the security and privacy benefits of conventional eHBC systems.

Preferred embodiments of the invention will now be discussed with respect to the drawings. The drawings may include schematic representations, which will be understood by artisans in view of the general knowledge in the art and the description that follows. Features may be exaggerated in the drawings for emphasis, and features may not be to scale.

FIG. 1A illustrates a preferred embodiment body area network and network transmission system of the invention on a person 10. The system includes coils 12 and 14 wrapped around the person 10 on the forearm area 16. The coils 12 and 14 are sized to slide over a hand 18 of the person and fit snugly over a portion of the forearm area 16. The coils 12 and 14 can be packaged in an arm band, such as normal packaging used for sports and medical devices worn or attached to a person. The coils 12 and 14 can also be packaged in a patch style arrangement, such that the coils 12 and 14 can be worn on other parts of the body, like the chest or shoulder. A patch 15 is also shown with the coils arranged therein being substantially parallel to the chest of the person 10. A transmitter 20 includes a transceiver circuit coupled to the magnetic coil. The transmitter 20 can also include standard electronics and be embedded in a package or connected into a sensor 22 that senses a condition, such as a pulse, temperature, acceleration, blood oxygenation, etc. The transmitter 20 and sensor 22 are represented schematically off body, for clarity of illustration, but would be small and worn on the body as part of the package with the coil or in a separate device(s) carried on the body and include a battery for power. The receiving coil 14 also connects to a receiver 24 and additional electronics 26 (also represented schematically off-body for clarity) that include a batter for power. The additional electronics and/or receiver can be part of a smart watch, smart phone, or dedicated analysis device.

One of the coils 12 acts as a transmitter (Tx) coil and generates magnetic energy. The other of the coils 14 acts as a receiver (Rx) coil and receives magnetic energy. The coils 14 can be worn on the body or can be associated with a device that is off the body but within the near field communication zone, such as a medical device near a patient or a sports monitoring device that a person will be nearby or pass. The first and second coils 12 and 14 can be conjugate matched with small capacitors be ~100 pF at 21 MHz. The generated magnetic fields travel freely through biological tissue, which enables a much lower path loss than both galvanic and capacitive eHBC approaches. The FIG. 1A system also places no requirement on the surrounding environment since magnetic fields can be sensed without a reference, and thus environmental effects and variance with posture are minimized. Both of these advantages serve to reduce the overall power of communication required in systems of the invention. To maximize communication distance and minimize path loss, resonant coupling (as opposed to inductive coupling) is preferred, but inductive coupling can be used to practice other embodiments. The preferred resonant coupling approach is comparable to the approach of some resonant wireless power transfer systems. See, B. L. Cannon, J. F. Hoburg, D. D. Stancil, and S. C. Goldstein, "Magnetic Resonant Coupling As a Potential Means for Wireless Power Transfer to Multiple Small Receivers," IEEE Trans. Power Electron., vol. 24, no. 7, pp. 1819-1825, July 2009.

Figure 1B:
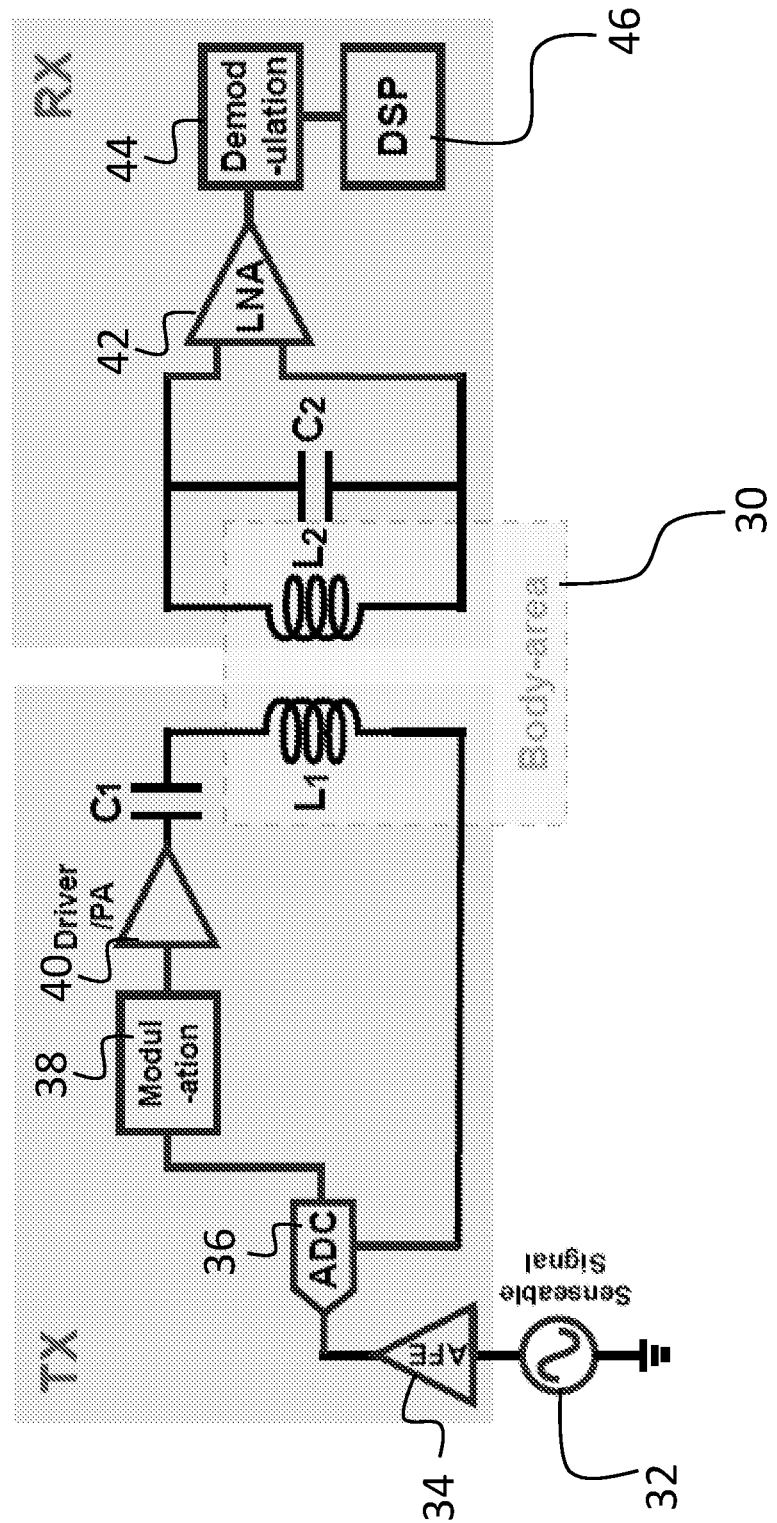
FIG. 1B is a block circuit diagram of a preferred embodiment sensing body area network and network transmission system of the invention.

FIG. 1B illustrates a sensor system using body area network 30 consistent with FIG. 1A. The sensor system of FIG. 1B includes a sensor 32 to sense a body or environmental condition. An amplifier 34 amplifies the signal from the sensor 32, which is then converted by an analog to digital converter 36 (if the sensor produces an analog output). The digital signal is then modulated (either converted to analog and modulated or digitally modulated) for transmission by a modulator 38. A power amplifier drives the transmission coil (represented as L1). On the receiver side, the receiver coil (represented as L2) is stimulated and it signal amplified by a low noise amplifier 42. The LNA 42 signal is demodulated (and converted to digital, if needed) by a demodulator 44. A digital signal processor 46 analyzes the signal to obtain data of interest based upon signals from the sensor 32 and provide the data to another device or application.

The wavelength of the magnetic field can be selected to balance privacy and sensing concerns. For example, the near-field region (wavelength/(2 pi)) at 21 MHz is 2.3 m, which ensures transmitted energy stays primarily in the magnetic near-field, thereby limiting propagation and broadcasting. Keeping the energy in the near field protects privacy, while extending the field permits communications with more distant magnetic coils. Preferred transmission frequencies are in the range of 1-100 MHz. Preferred transmission frequencies for maximizing security are in the range of from 20 to 50 MHz, while preferred transmission frequencies for maximizing the distance between transmitter and an off-body receiver coil are in the range of from 10 to 30 MHz. Generally, shortening the wavelength with higher frequencies extends power toward further field, while lengthening the wavelength with lower frequencies reduces power away from the near field.

Figure 2A:
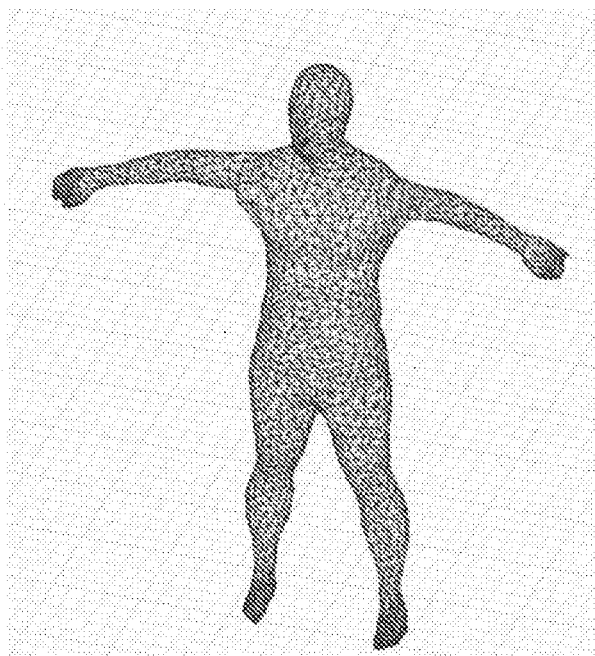
FIGS. 2A and 2B respectively illustrate body surface meshes used in simulations of the FIG. 1A system for a human body posture with outstretched arms and a human body with relaxed harms.
Figure 2B:
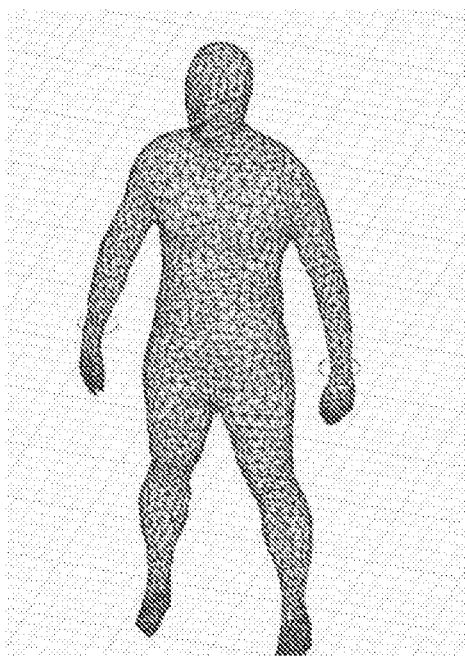

Simulations were conducted to validate the preferred FIG. 1A embodiment. an FEM simulation model is designed in Ansys HFSS using realistic geometries and tissue properties. Specifically, a realistic mesh model of the human body was provided by NEVA Electromagnetics Inc. [G. Noetscher, Aung Thu Htet, and S. Makarov. (October, 2012). N-Library of basic triangular surface human body meshes from male subjects. NEVA EM LLC. [Online] Available: http://www.nevaelectromagnetics.com/SurfaceHumanBodyMe-shes.html], obtained by scanning a standing male subject with a WB4 laser. Respective spread arm and relaxed arm postures mesh models are shown in FIGS. 2A and 2B. Though internal organs were not modeled, the developed model was sufficient to simulate path loss and field distributions around the body.

Figure 3A:
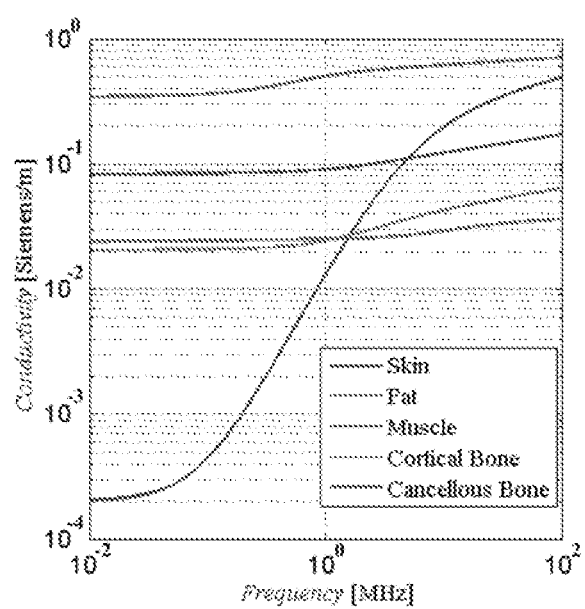
FIGS. 3A and 3B respectively plot dielectric properties of human tissue versus frequency for conductivity and permittivity.
Figure 3B:
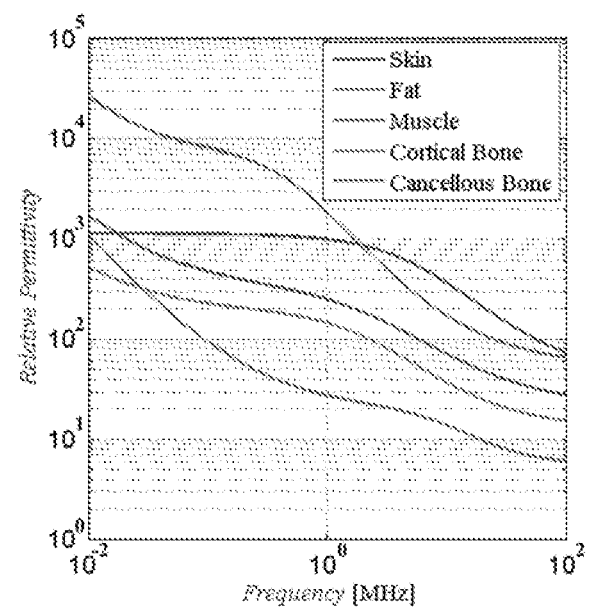

To ensure electromagnetic simulations produced realistic results, dielectric properties of biological tissue must be considered. Although a fully-modeled internal body structure is possible, the complexity of the resulting geometry would have required prohibitively long simulations. Instead, the dielectric properties of internal tissues were averaged over the body, weighted by their respective volumes, to reduce the number of dielectric layers. The dielectric properties themselves are shown in FIGS. 3A and 3B for several representative tissue types. The properties were based upon prior published research. D. Andreuccetti, R. Fossi and C. Petrucci. (1997). "An Internet resource for the calculation of the dielectric properties of body tissues in the frequency range 10 Hz-100 GHz." IFAC-CNR. Florence, Italy. [Online] Available: http://niremf.ifac.cnr.it/tissprop/

Figure 4A:
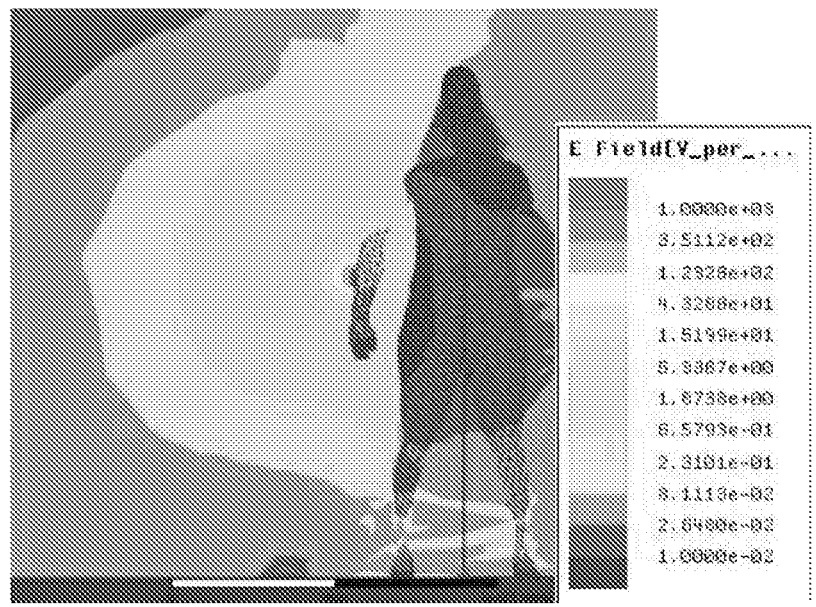
FIGS. 4A and 4B respectively illustrate field patterns for prior capacitive eHBC electrodes (electric field) and the present mHBC (magnetic human body channel) coils.

FIGS. 3A and 3B include data indicating that human tissues have high permittivity and low conductivity at MHz frequencies, confirming the large path loss seen in eHBC systems. Interestingly, these numbers suggest that electric fields may travel better through the air than through tissue at higher frequencies. This is confirmed by observing the field pattern of a simulation of wrist-to-wrist capacitive communication at 21 MHz as shown in FIG. 4A. Operating at a lower frequency can restrict fields to lie more within the human body, at the cost of increased path loss or lower channel bandwidth.

Figure 4B:
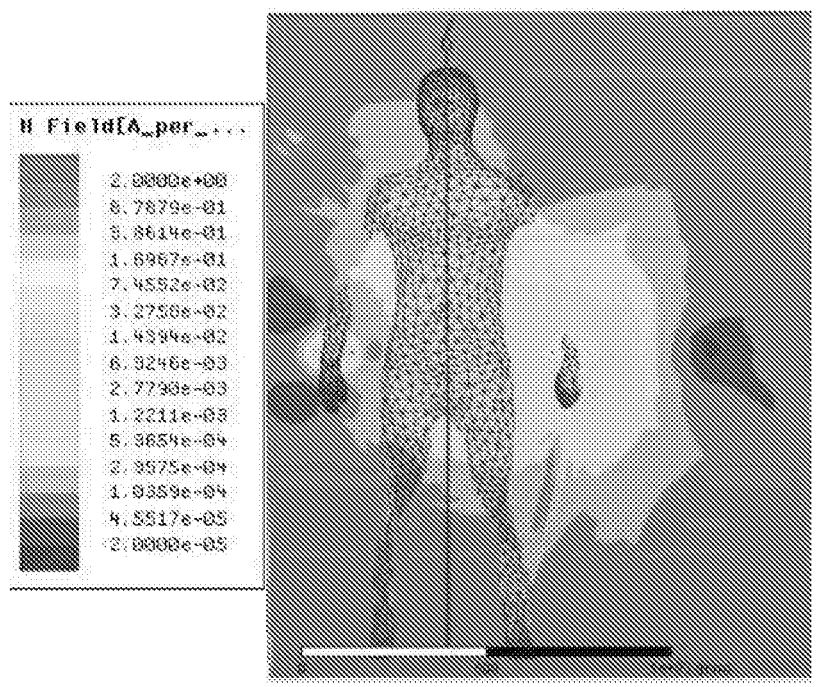

On the other hand, since the permeability of most biological tissue is similar to air, magnetic fields can travel much more freely through the human body, as seen in FIG. 4B. Although human tissues exhibit diamagnetism due to slightly less permeability than free space, the opposite direction magnetic field induced by tissues is very small, so the effect can be largely ignored. In addition, the low conductivity of human tissues at lower frequency induces only small eddy currents, further limiting losses. For these reasons, mHBC fields achieve very low-loss in biological tissue, and in some cases anatomy can act as a waveguide to further reduce the path loss compared to operating only in air. Thus, mHBC systems offer superior path loss performance compared to comparable eHBC alternatives.

Simulations were conducted. The simulations were also validated via measurements with an actual human subject, using the experimental set up and positions shown in FIG. 5 on the extended wrists (ATP1, AR2P1), upper arm (AR1), wrists at side (ATP2, AR2P2), head (HR) and calf (LR). Two types of coils were designed for simulations as magnetic field sources or sinks in HFSS. For the arms and legs, 10 cm diameter coils using 10 AWG (2.6 mm diameter) copper wire were employed. For the head, 18 cm diameter coils were employed. To enable resonant operation, the designed coils were terminated with capacitors tuned for a resonant frequency of 21 MHz. To obtain accurate results from HFSS simulations, a Delta-S of 0.01 was used for the convergence value of s-parameter, resulting in greater than 700,000 generated meshes for the entire simulated geometry. A mixed order of basis functions was applied in order to calculate with efficiently generated meshes for the near-field radiation.

Unlike eHBC systems, which cannot use wall-powered devices due to ground loop coupling, magnetic fields are reference-free, and thus an Agilent E5071C vector network analyzer (VNA) could be used. The same two types of coils as described above for simulations were fabricated for the measurement experiment using 10 AWG enameled copper wires with PVC tubes for insulation.

Unlike conventional eHBC electrodes that are difficult to match due to the need for prohibitively large inductors, mHBC coils can be conjugate-matched using small capacitors. Matching is not necessary, but can be used to optimize performance. This implies that mHBC systems can be easily reconfigured to operate at any frequency below the self-resonant frequency of the coil. Thus, rather than measuring $S_{21}$ at a small handful of frequencies after manually tuning resonant capacitors, the full set of S-parameters were measured and used to estimate the maximum available gain (MAG)—the path loss of the system assuming perfect matching. To obtain accurate measured data, each measurement was performed three times and the S-parameters were averaged prior to MAG computation. To validate the choice of using MAG as a metric, $S_{21}$ measurements were also taken with through-hole capacitors placed on the coil feeding ports to resonate at 21 MHz. In this case, $S_{21}$ measurements at 21 MHz matched MAG results within 8.7%.

Figure 5:
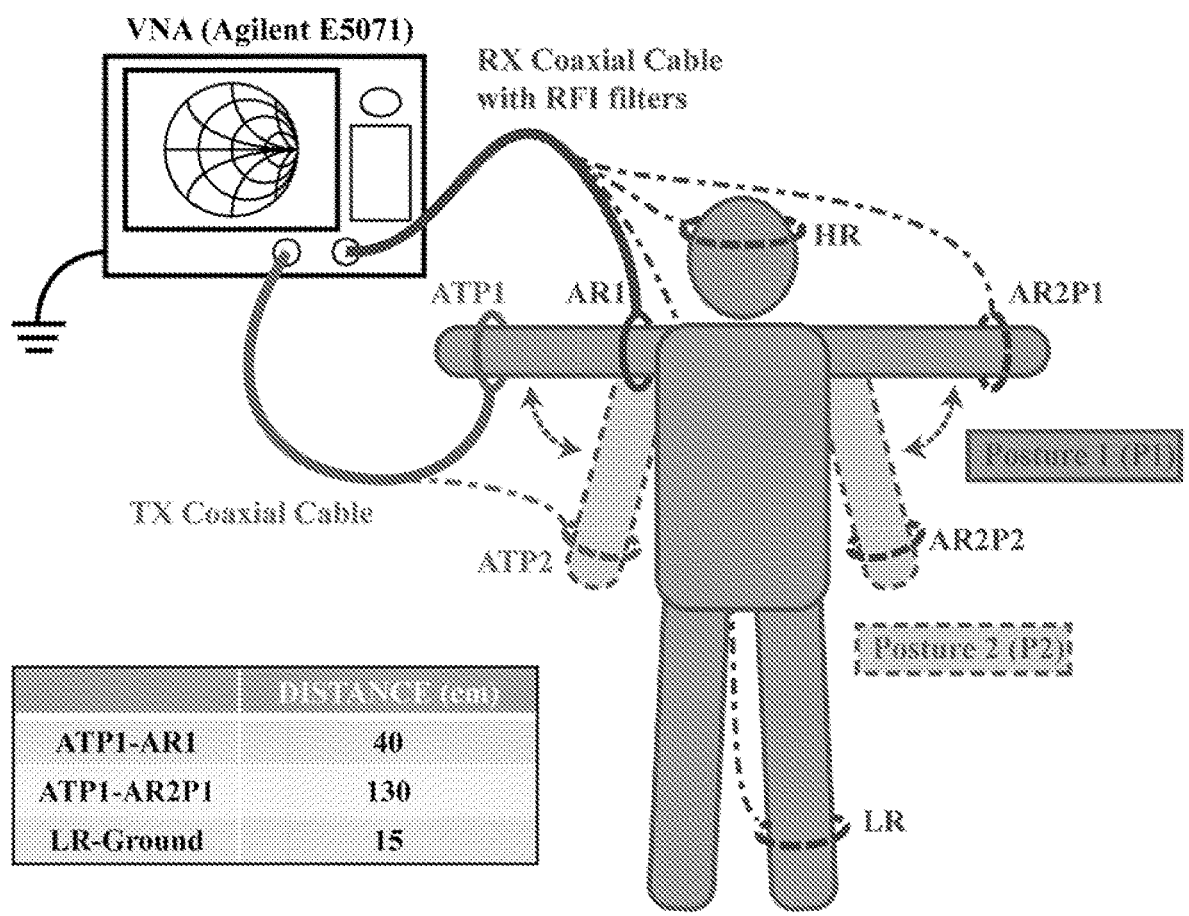
FIG. 5B illustrates an experimental set up for measurement of an mHBC of the invention.
Figure 6:
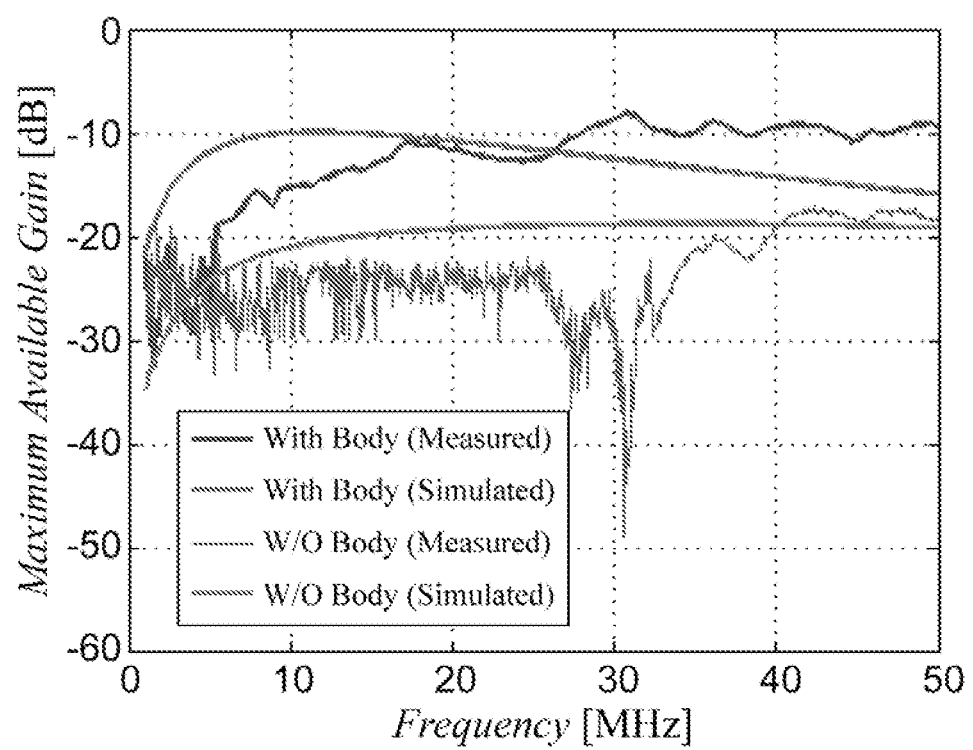
FIG. 6 plots measurement results with simulated data for an mHBC of the invention with a transmitter to receiver arm to arm distance of 40 cm (ATP1 to AR1 in FIG. 5)
Figure 7A:
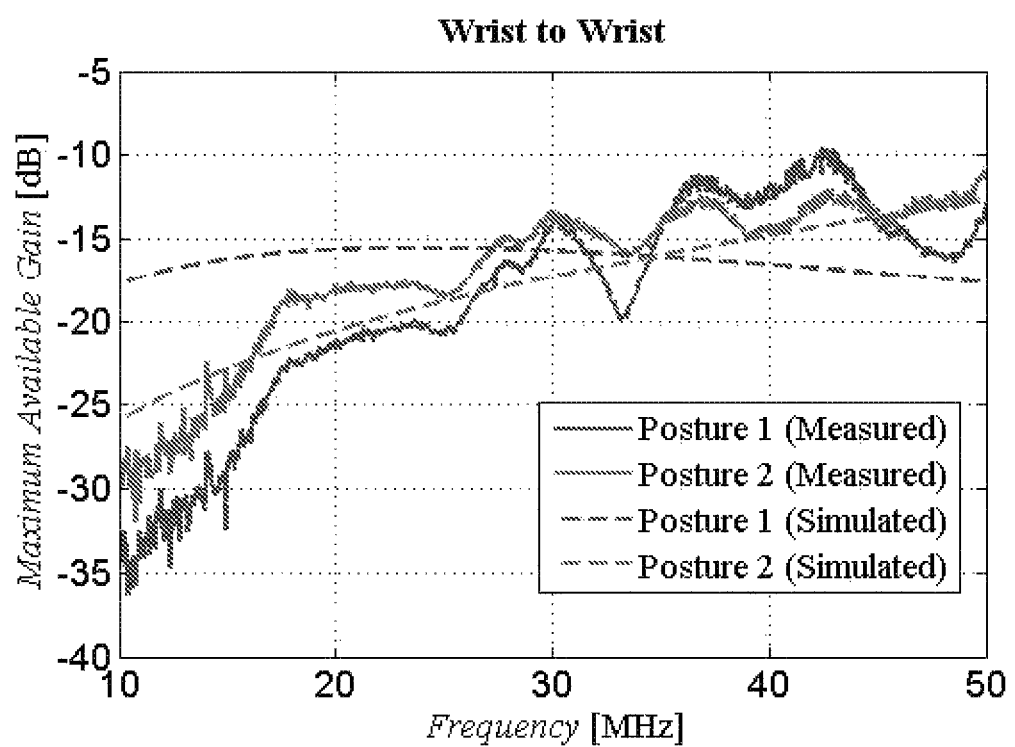
FIGS. 7A-7C respectively plot measurement results and simulated data for an mHBC of the invention with a transmitter to receiver arm to arm positions in FIG. 5 of AR2P1 and AR2P2 to ATP1 and ATP2 (FIG. 7A), HR to ATP1 and ATP2 (FIG. 7B) and LR to ATP1 and ATP2 (FIG. 7C)
Figure 7B:
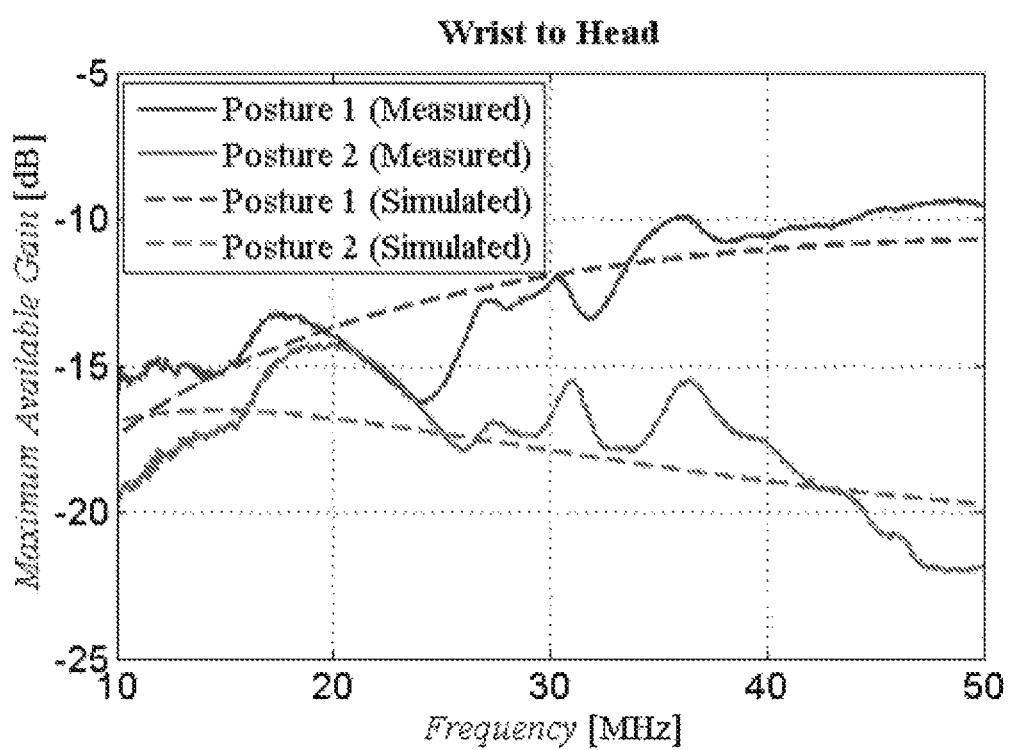
Figure 7C:
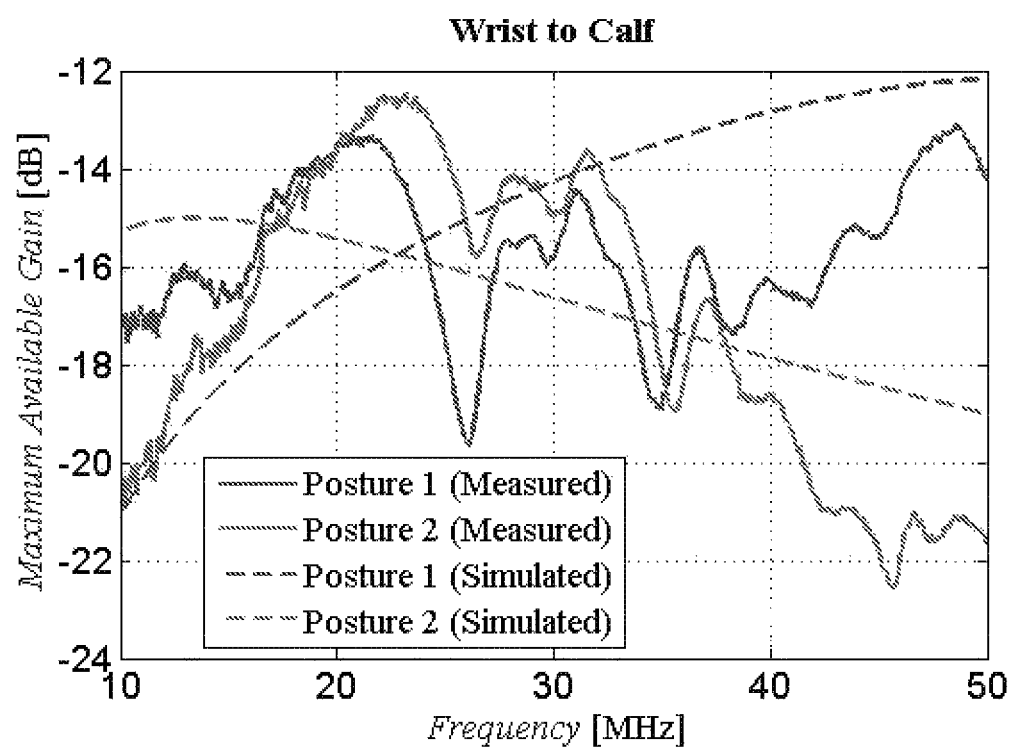

FIG. 6 shows the results of both simulation and measurement for the scenario where two coils were placed 40 cm apart either on an outstretched arm (ATP1 and AR2P1), or in free space for comparison. Here, measurements show that the minimum path loss is 8.1 dB. Interestingly, this is upwards of 10 dB better than in free space, validating our prediction that the body acts as an efficient conduit of magnetic energy. Similar measurements were repeated for the two different body postures and three coil locations illustrated in FIG. 5, with results shown in FIGS. 7A-7C. In all cases, path loss is less than 20 dB for most frequencies above 20 MHz, and can approach sub-10 dB path loss in several cases. This represents a substantial improvement in path loss performance compared to conventional BAN radios (estimated at 30-80 dB) and capacitive eHBC (estimated at 20-50 dB).

Figure 8:
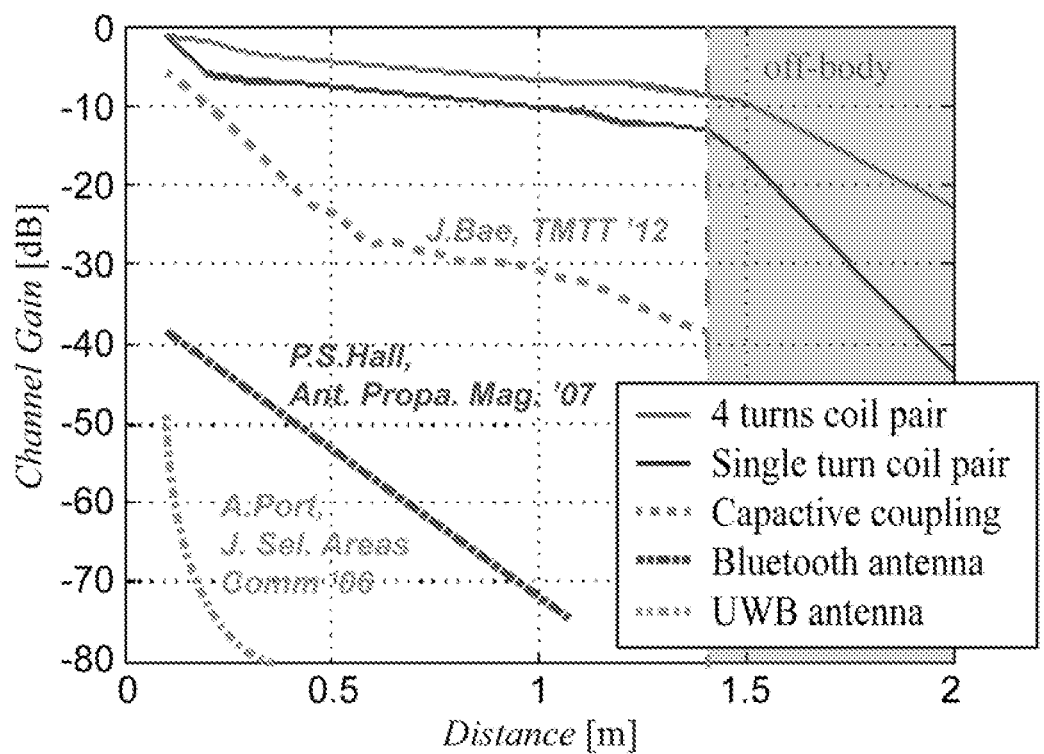
FIG. 8 plots path loss v distance for the wrist to wrist posture 1 of FIG. 5 (ATP1 to AR2P1) for the mHBC of the invention, a capacitive coupling eHBC and a UWB antenna.

The performance of the preferred mHBC was also benchmarked across a range of distances for single-turn and 4-turn coils in FIG. 8. Here it can be seen that path loss is less than 13.1 dB for both cases when signals are received on the body. Path loss sharply increases (i.e., channel gain decreases) when measurements are taken off the body, again indicating that the magnetic body area network reduces path losses. Due to better magnetic field generation, the 4-turn coil system offered a 6.7 dB performance improvement over the single-turn coil. FIG. 8 also shows the measured path loss of capacitive coupling [Bae, H. Cho, K. Song, H. Lee, and H.-J. Yoo, "The Signal Transmission Mechanism on the Surface of Human Body for Body Channel Communication," IEEE Trans. Microw. Theory Tech., vol. 60, no. 3, pp. 582-593, March 2012] and a conventional WBAN using UWB [A. Fort, J. Ryckaert, C. Desset, P. De Doncker, P. Wambacq, and L. Van Biesen, "Ultra-wideband channel model for communication around the human body," IEEE J. Sel. Areas Commun., vol. 24, no. 4, pp. 927-933, April 2006] based on results found in the identified literature. The number of turns in an mHBC of the invention can be selected based upon the particular application. The higher Q of multi-turn coils makes the matching bandwidth narrowed, and multi-turn coils are less well suited for high-speed data transfer, but when the data rate is slow, more turns can enhance the coupling as the operating frequency is lower than the self resonance frequency (SRF) of coils. Multi turn coils have lower SRF compared to a single turn coil.

Figure 9A:
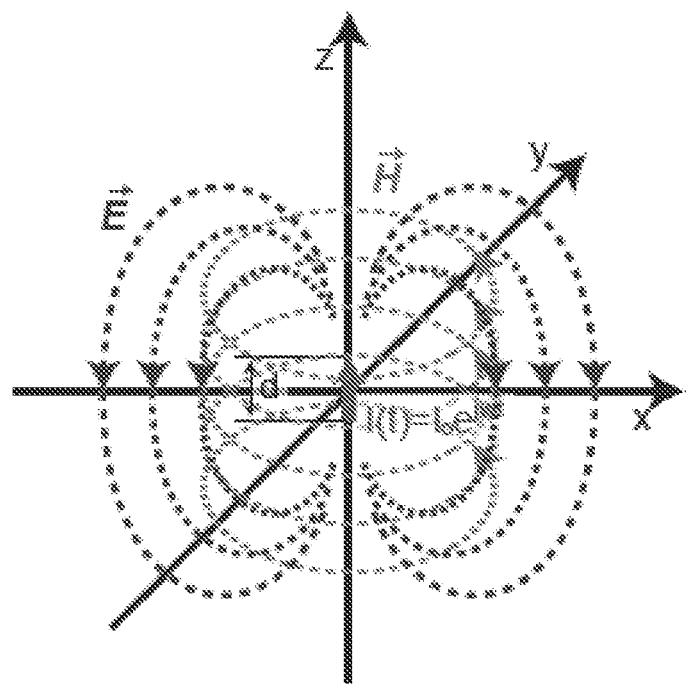
FIG. 9A illustrates a Hertzian electric dipole and its field pattern in the near-field and FIG. 9B a magnet dipole by an ideal loop current and its field pattern in the near-field.
Figure 9B:
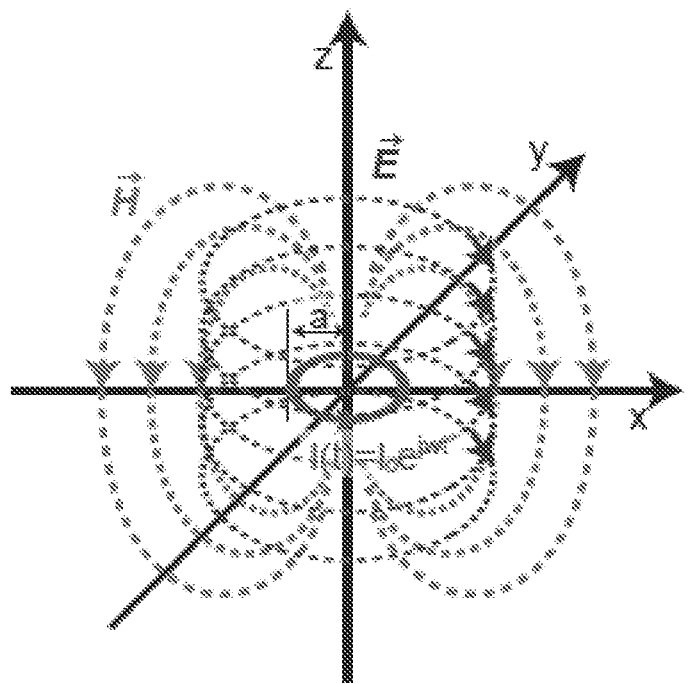

The mHBC system of the invention has also been modeled mathematically and compared to an eHBC system. An eHBC can be generalized to an ideal dipole that is known as a Hertzian electric dipole and is illustrated in FIG. 9A. FIG. 9B shows a magnetic dipole by an ideal loop current and its field pattern in the near field. When this ideal electric dipole is placed in free space with the geometry depicted FIG. 9A, the E and H-field pattern is given as follows.

$$\vec{A}\text{(vector potential)} = \frac{\mu_o I_o d}{4\pi r}(\vec{r}\cos\theta - \vec{\theta}\sin\theta)e^{-j(k_o r - \omega t)} \quad (1a)$$

$$\vec{H} = \frac{1}{\mu_o}\nabla \times \vec{A} = \vec{\phi}\frac{jk_o^2 I_o d}{4\pi}\left[\frac{1}{k_o r} + \frac{1}{j(k_o r)^2}\right]\sin\theta e^{-j(k_o r - \omega t)}$$

-continued $$\vec{E} = \frac{1}{j\omega\epsilon_o}\nabla \times \vec{H} = \eta_o \frac{jk_o^2 I_o d}{4\pi} \quad (1b)$$

$$\left\{\vec{r}\left[\frac{1}{j(k_o r)^2} - \frac{1}{(k_o r)^3}\right]2\cos\theta + \vec{\theta}\left[\frac{1}{k_o r} + \frac{1}{j(k_o r)^2} - \frac{1}{(k_o r)^3}\right]\sin\theta\right\}$$
$$e^{-j(k_o r - \omega t)}$$

where $I_o$ is the magnitude of wire current, d is the dipole length, $k_o$ is the wave number ($2\pi$/wavelength in free space), $\mu_o$ is the permeability of free space, $\epsilon_o$ is the permittivity of free space, $n_o$ is the radiation impedance in free space, and $\omega$ is the angular frequency ($2\pi$ frequency). In equations (1a) and (1b), $1/k_o r$, $(1/k_o r)^2$, and $(1/k_o r)^3$ terms are defined as the radiation, induction, and quasi-static portion, relatively. Generally, these three definitions can be classified as the far-field or near-field portion according to their dominant region, for example, the radiation (or real) power derived from $1/k_o r$ term in both (1a) and (1b) dominates in the far-field region ($k_o r > 1$) and the reactive (or imaginary) power by $(1=k_o r)^2$ and $(1=k_o r)^3$ terms can be stored in the standing (or non-radiating) wave of the near-field region ($k_o r < 1$).

The human body has finite relative permittivity ($\epsilon_r$), (1a) and (1b) can be rewritten with k ($=k_o\sqrt{\epsilon_r}$) and $\eta$ ($=\eta_o\sqrt{\epsilon_r}$) as follows:

$$\vec{H} = \vec{\phi}\frac{jk_o^2 I_o d}{4\pi}\left[\frac{\sqrt{\epsilon_r}}{k_o r} + \frac{1}{j(k_o r)^2}\right]\sin\theta e^{-j(kr-\omega t)} \quad (2a)$$

$$\vec{E} = \eta_o\frac{jk_o^2 I_o d}{4\pi}\left\{\vec{r}\left[\frac{1}{j\sqrt{\epsilon_r}(k_o r)^2} - \frac{1}{\epsilon_r(k_o r)^3}\right]2\cos\theta + \right. \quad (2b)$$
$$\left. \vec{\theta}\left[\frac{1}{k_o r} + \frac{1}{j\sqrt{\epsilon_r}(k_o r)^2} - \frac{1}{\epsilon_r(k_o r)^3}\right]\sin\theta\right\}e^{-j(kr-\omega t)}$$

Equation (2b) verifies that the high permittivity of human tissues degenerates the near-field portion of E-field pattern, as a result, the E-field coupling between two capacitive antennas shows a disadvantage when the physical communication channel is biological tissues. Although (2a) and (2b) exclude the negative effect caused by the conductivity of biological tissues, it is enough to analyze the field intensity inside the human body that provides quite high relative permittivity and ignorable conductivity ($\sigma$) at lower frequency where the HBC physical channel usually operates. ($\epsilon_r \approx 80$, $\sigma \approx 0:15$ S/m) at 21 MHz).

Analysis for the complex Poynting vector (power density) can address the degradation of near-field coupling in the human body more apparently as shown below.

$$\vec{W} = \frac{1}{2}\vec{E}\times\vec{H}^* \quad (3)$$

$$= \vec{r}E_\theta H_\phi^* - \vec{\theta}E_r H_\phi^*$$

$$= \eta\frac{k^2 I_o^2 d^2}{32\pi^2 r^2}\left\{\vec{r}\left[1 - j\frac{1}{(kr)^3}\right]\sin^2\theta + \vec{\theta}\left[j\frac{1}{kr} + j\frac{1}{(kr)^3}\right]\sin 2\theta\right\}$$

$$\text{Re}(\vec{W}) = \vec{r}\frac{\sqrt{\epsilon_r}\,\eta_o k_o^2 I_o^2 d^2}{32\pi^2 r^2}\sin^2\theta \text{ (Radiation)} \quad (3a)$$

$$\text{Im}_1(\vec{W}) = -\vec{\theta}\frac{\eta_o k_o^3 I_o^2 d^2}{32\pi^2 r^2}\sin 2\theta \text{ (Induction)} \quad (3b)$$

$$\text{Im}_2(\vec{W}) = \frac{\eta_o k_o^2 I_o^2 d^2}{32\pi^2 \epsilon_r k_o r^5}(\vec{\theta}\sin 2\theta - \vec{r}\sin^2\theta) \text{ (Quasi-static)} \quad (3c)$$

Figure 10:
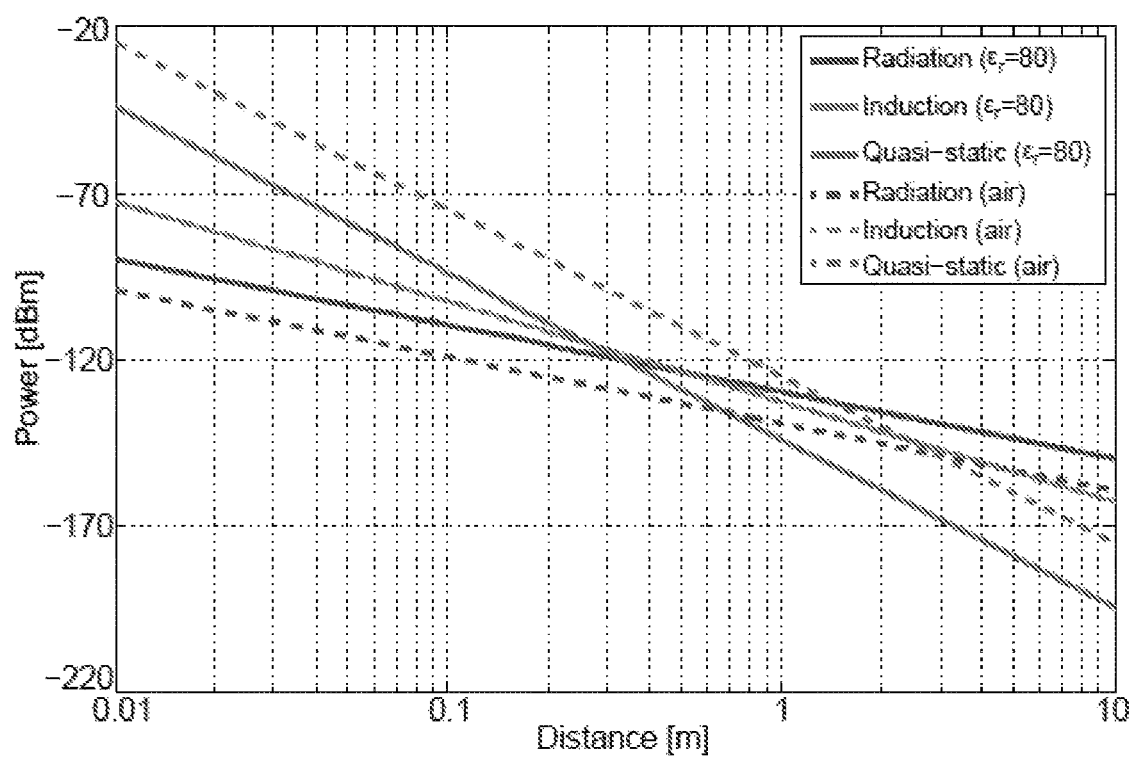
FIG. 10 plots classified power density generated by an ideal electric dipole antenna placed in the biological tissue or in the air.

FIG. 10 illustrates the power density generated by an ideal electric dipole located in free space or in the high permittivity medium ($\epsilon_r \approx 80$) when d=1 cm, $I_o$=1 µA, and $\theta$=45°. Here, while the radiation power increases $\sqrt{\epsilon_r}$ times, the quasi-static portion, that dominates in the near-field region where the coupling between two dipoles is generally utilized, is diminished by $\epsilon_r$, as a result, the capacitive coupling for eHBC electrode pairs deteriorates when the biological tissues is utilized as the coupling medium. In addition, the near-field region ($r < 1/k = \lambda/2\pi$) is shrunk by the decreased quasi-static portion, which can be explained with the shorten wavelength. ($\lambda = \lambda_o\sqrt{\epsilon_r}$, $\lambda_o$, is the wavelength in free space.)

On the other hand, the magnetic dipole by an ideal loop current can take an advantage on the near-field coupling in the high permittivity material, unlike the electric dipole. This benefit can be observed in the following E and H-field pattern of the magnetic dipole illustrated in FIG. 1(b).

$$\vec{A} = \vec{\phi}\frac{j\mu k I_o \pi a^2}{4\pi r}\left(1 + \frac{1}{jkr}\right)\sin\theta e^{-j(kr-\omega t)} \quad (4a)$$

$$\vec{E} = \vec{\phi}\frac{\eta_o k_o^3 I_o a^2}{4}\left[\frac{\sqrt{\epsilon_r}}{k_o r} + \frac{1}{j(k_o r)^2}\right]\sin\theta e^{-j(kr-\omega t)}$$

$$\vec{H} = -\frac{k_o^3 I_o a^2}{4} \quad (4b)$$

$$\left\{\vec{r}\left[\frac{\sqrt{\epsilon_r}}{j(k_o r)^2} + \frac{1}{(k_o r)^3}\right]2\cos\theta + \vec{\theta}\left[\frac{\epsilon_r}{k_o r} + \frac{\sqrt{\epsilon_r}}{j(k_o r)^2} + \frac{1}{(k_o r)^3}\right]\sin\theta\right\}$$
$$e^{-j(kr-\omega t)}$$

Equation (4b) describes that the high permittivity of a medium enhances both the radiation and induction portion of H-field generated by a magnetic dipole unlike an electric dipole that shows the degenerating of quasi-static near-field portion in the high permittivity medium. The complex Poynting vector (power density) verifies this benefit of a magnetic dipole source inside a high dielectric material.

$$\vec{W} = \frac{1}{2}\vec{E}\times\vec{H}^* \quad (5)$$

$$= \vec{\theta}E_\phi H_r^* - \vec{r}E_\phi H_\theta^*$$

$$= \eta\frac{k^4 I_o^2 a^4}{32 r^2}\left\{\vec{r}\left[1 + j\frac{1}{(kr)^3}\right]\sin^2\theta - \vec{\theta}\left[j\frac{1}{kr} + j\frac{1}{(kr)^3}\right]\sin 2\theta\right\}$$

$$\text{Re}(\vec{W}) = \vec{r}\frac{\sqrt{\epsilon_r^3}\,\eta_o k_o^4 I_o^2 a^4}{32 r^2}\sin^2\theta \text{ (Radiation)} \quad (5a)$$

$$\text{Im}_1(\vec{W}) = -\vec{\theta}\frac{\epsilon_r \eta_o k_o^3 I_o^2 a^4}{32 r^2}\sin 2\theta \text{ (Induction)} \quad (5b)$$

$$\text{Im}_2(\vec{W}) = \frac{\eta_o k_o I_o^2 a^4}{32 r^5}(\vec{r}\sin^2\theta - \vec{\theta}\sin 2\theta) \text{ (Quasi-static)} \quad (5c)$$

Figure 11:
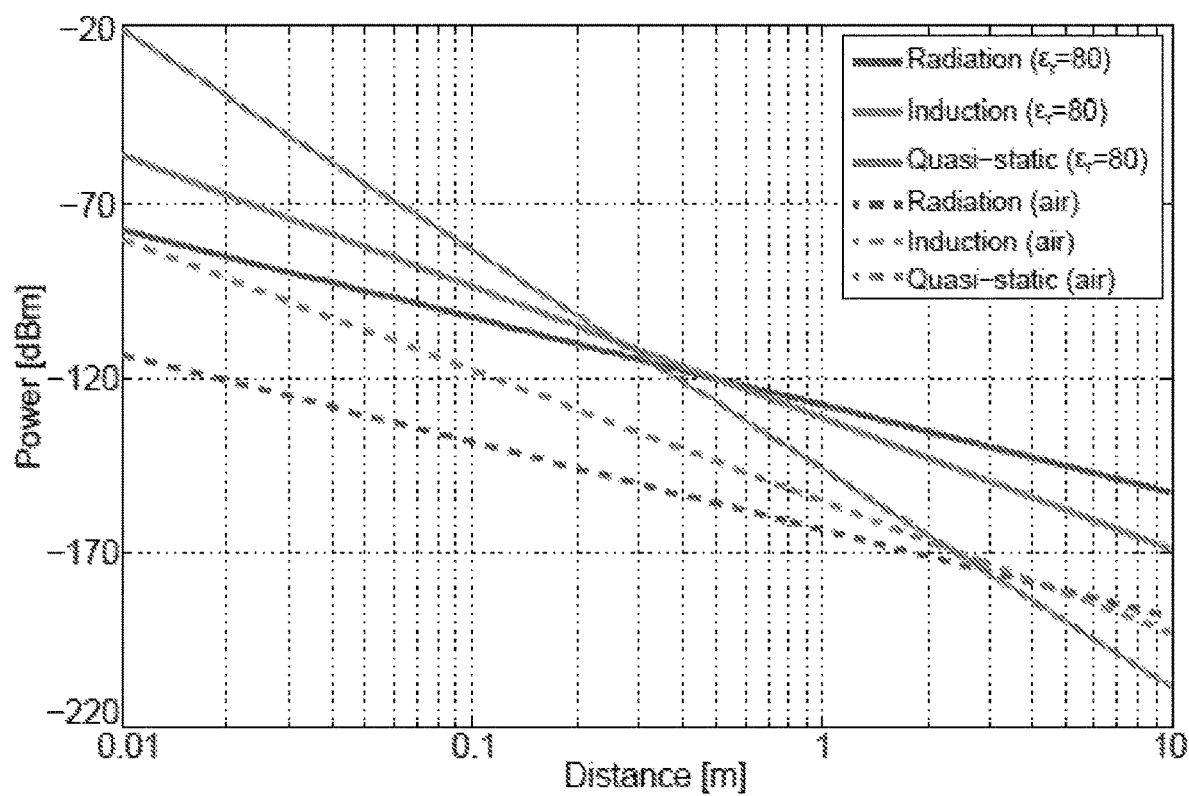
FIG. 11 plots classified power density generated by an ideal magnetic dipole antenna placed in the biological tissue or in the air.

FIG. 11 depicts the power density describing in (5a), (5b), and (5c) with an ideal loop current located in free space or in the high permittivity medium ($\epsilon_r$=80) when a $\alpha$=2$\pi$ cm $I_o$=1 µA, and $\theta$=45° Unlike the electric dipole showing the reduction of quasi-static power inside high dielectrics, the magnetic dipole placed in high permittivity material accomplishes enhancement of both induction and radiation power without the loss of quasi-static power. Although, as a result of enhancing the radiation power, the near-field region seems shrunken, the reinforced total complex power helps the coupling between the coils improved when the current flowing inside the coil keeps same.

Figure 12:
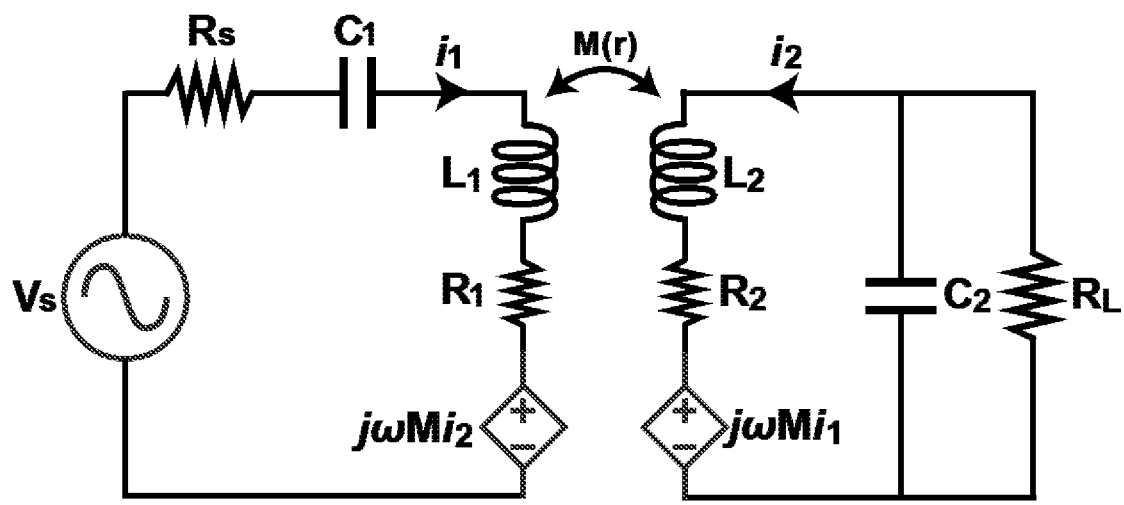
FIG. 12 is a simplified circuit model of magnetic resonant coupling in the body area in accordance with the invention.

The invention leverages the recognition of the inventors that the best way to utilize a magnetic source for the commutation in the body area (<~2 m) is to deploy the magnetic resonance coupling between the coils because this coupling mechanism successfully employs the near-field portion that diminishes sharply by the distance. A data transfer system using the magnetic resonance coupling can be simply modeled as shown in FIG. 12. When this system is given with the optimal resistances at both source and load as well as the proper tuning capacitances for both coils, the maximum available gain is represented as shown below. This can be affected by the body style of a person, and systems of the invention can include automatic tuning that is based upon real-time calibration measurements. (The approximation is available only when two coils have a loosely coupled coupling shown in general near-field communication links.)

$$G_{max}(r) = \frac{P_{load,max}(r)}{P_{source,max}} \approx \frac{\frac{\omega^2 V_s^2 M(r)^2}{16R_1^2 R_2}}{\frac{V_s^2}{4R_1}} = \frac{\omega^2 M(r)^2}{4R_1 R_2} \quad (6)$$

In (6), when the geometry of both coils provides certain resistances, only mutual inductance (M) decides the channel Therefore, exploring the influence of the human body on the mutual inductance is imperative for utilization of the magnetic coupling for body-area networks. Here, the mutual inductance is defined as how much the magnetic field flux generated by the current of the primary coil can flow through the inner dimension of the secondary coil as described below.

$$M(r) = \frac{\Phi_{21}(r)}{I_1} = \frac{\int_{A_2} B_1(r) dA}{I_1} = \frac{A_2}{I_1} B_{1,averaged}(r) \quad (7)$$

Equation (7) verifies that the mutual inductance is proportional to the averaged magnetic flux density over the inner area of the secondary coil when the current in the primary coil and the geometry of the secondary are fixed.

Figure 13A:
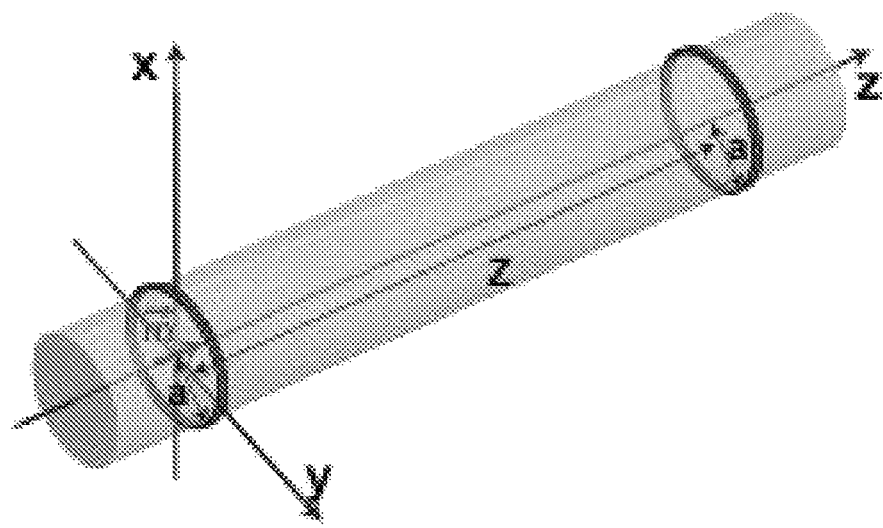
FIGS. 13A-13C illustrate magnetic coupling for an arm to arm transmitter and receiver coil.

The systems of the invention include coils that can be conveniently wrapped around a portion of human anatomy. FIG. 5 shows various options, and the mathematical modelling discuss now assumes that primary and secondary coils are wrapped around a cylindrical human arm model with having a certain distance. This model is illustrated with respect to the x, y an z axes in FIG. 13A. For the sake of simplicity of analysis, the magnetic source by the current flowing in the primary coil can be estimated as an ideal magnetic dipole generating the fields described in (4a) and (4b). Equation (4a) and (4b), here, can be split into two by the far-field and near-field definition.

$$\vec{E}_{near} = -\hat{\phi} \frac{j\eta k^3 I_o a^2}{4} \left(\frac{1}{kr}\right)^2 \sin\theta e^{-j(kr-\omega t)} \quad (8a)$$

$$\vec{H}_{near} = \frac{k^3 I_o a^2}{4} \left[\frac{j}{(kr)^2} - \left(\frac{1}{kr}\right)^3\right] (\hat{r} 2\cos\theta + \hat{\theta}\sin\theta) e^{-j(kr-\omega t)} \quad (8b)$$

$$\vec{E}_{far} = -\hat{\phi} \frac{\eta k^3 I_o a^2}{4} \left(\frac{1}{kr}\right)^2 \sin\theta e^{-j(kr-\omega t)} \quad (9a)$$

$$\vec{H}_{far} = -\hat{\theta} \frac{k^3 I_o a^2}{4} \left(\frac{1}{kr}\right) \sin\theta e^{-j(kr-\omega t)} = \frac{1}{\eta} \hat{r} \times \vec{E}_{far} \quad (9b)$$

Unlike the near-field portion described in (8a) and (8b), the far-field portion in (9a) and (9b) forms a transverse electromagnetic (TEM) wave that E and H field are coupled with each other in terms of the radiation impedance η and the radiation direction vector $\vec{r}$. Therefore, the common EM wave theory is still available for the far-field portion by the magnetic dipole even inside the human body.

Figure 13B:
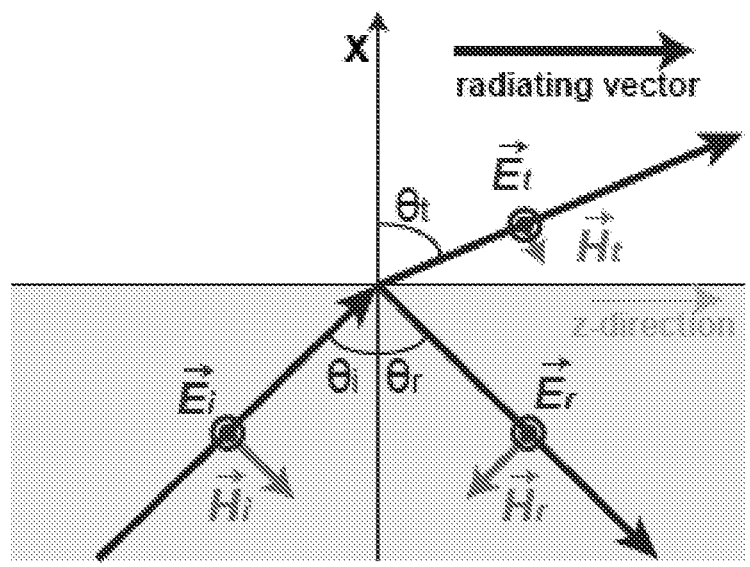

The placing of a human arm model in the air creates the boundary condition at the interface between the air and the human tissue while the EM radiating wave generated by a magnetic dipole is propagating inside the body. FIG. 13B depicts the reflections and transmission at the boundary of the human body when the perpendicularly polarized EM wave incidents obliquely. When the wave has the perpendicular polarization as described in (9a) and (9b), the Snell's law (10) provides two relations about the reflections and transmission.

In order for the total reflection ($|\Gamma_\perp|=1$) to happen at the boundary, $\cos\theta_t$ in (11a) should be zero or imaginary. With this condition, the critical angle ($\theta_c$) can be derived by (10) as below.

$$\cos\theta_t = \sqrt{1 - \sin^2\theta_t} = \sqrt{1 - \epsilon_r \sin^2\theta_i} \quad (12)$$

$$\theta_i >= \theta_c = \arcsin\left(\sqrt{\frac{1}{\epsilon_r}}\right)$$

Figure 13C:
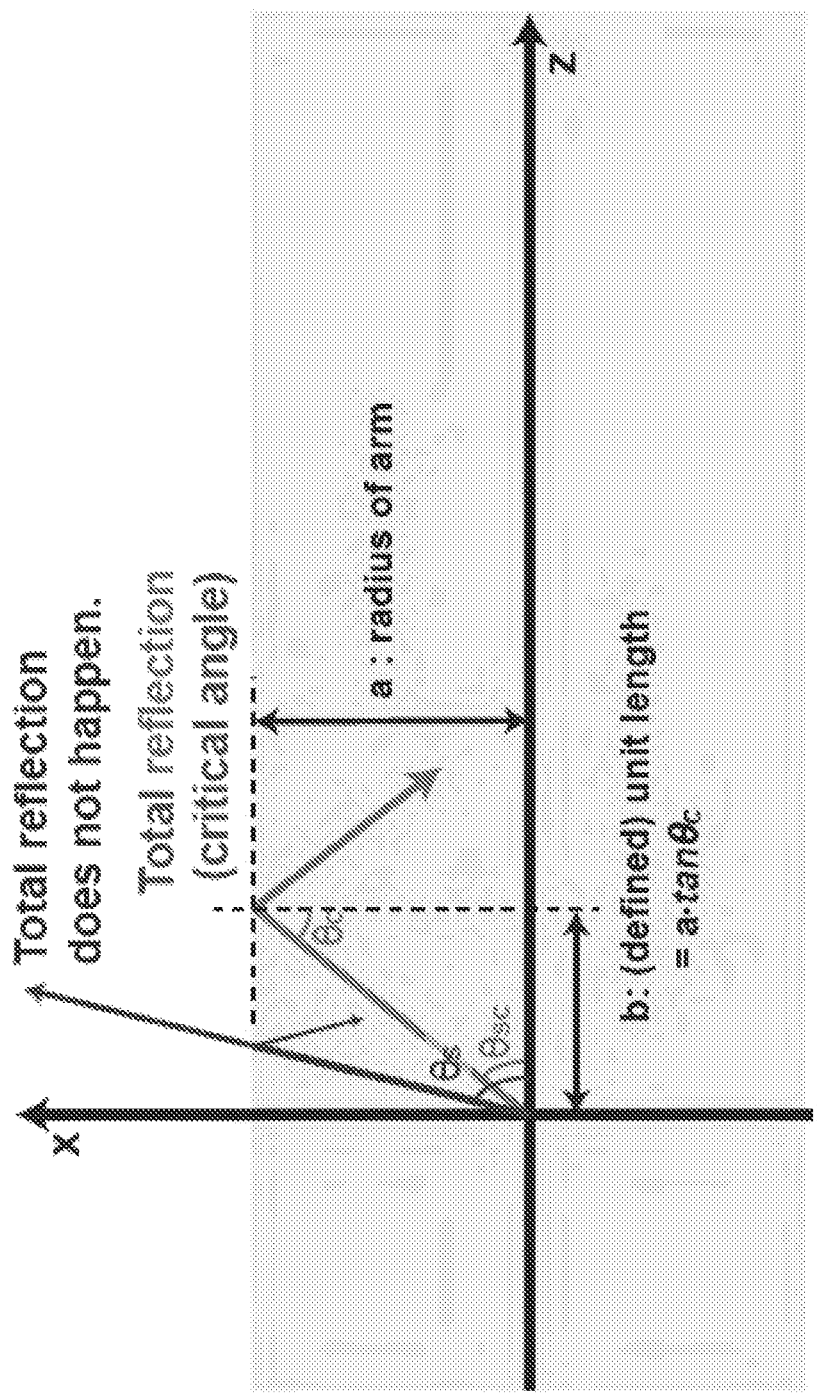

For example. when the magnetic dipole by the primary coil is placed at the center of the cylindrical human arm model which has $\epsilon_r=80$, the critical incident angle is calculated as 6.4°, which means the total reflection happens if the radiation angle from the source ($\theta_s$) is smaller than the critical radiation angle ($\theta_{sc}=90°-\theta_s=83.6°$) as depicted in FIG. 13C. Here, the unit length (b) can be defined as a tan $\theta_c$ to indicate the distance in terms of the radius of arm (a) and the critical angle ($\theta_c$).

Figure 14A:
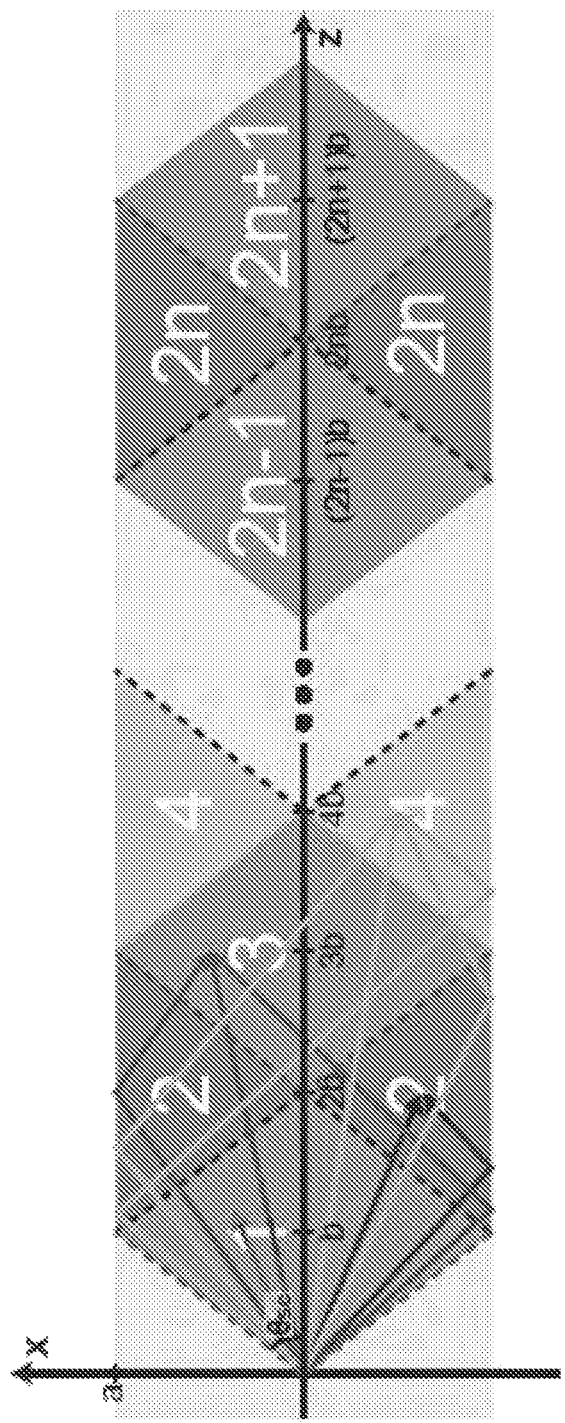
FIGS. 14A-14C respectively model total reflection inside the body for each of a generalization of the number of fluxes reaching at the observing point 9 FIG. 14A, effective radius model for a simplified calculation (FIG. 14B) and consideration on the rotating (FIG. 14C) H-field direction for vector sum.
Figure 14B:
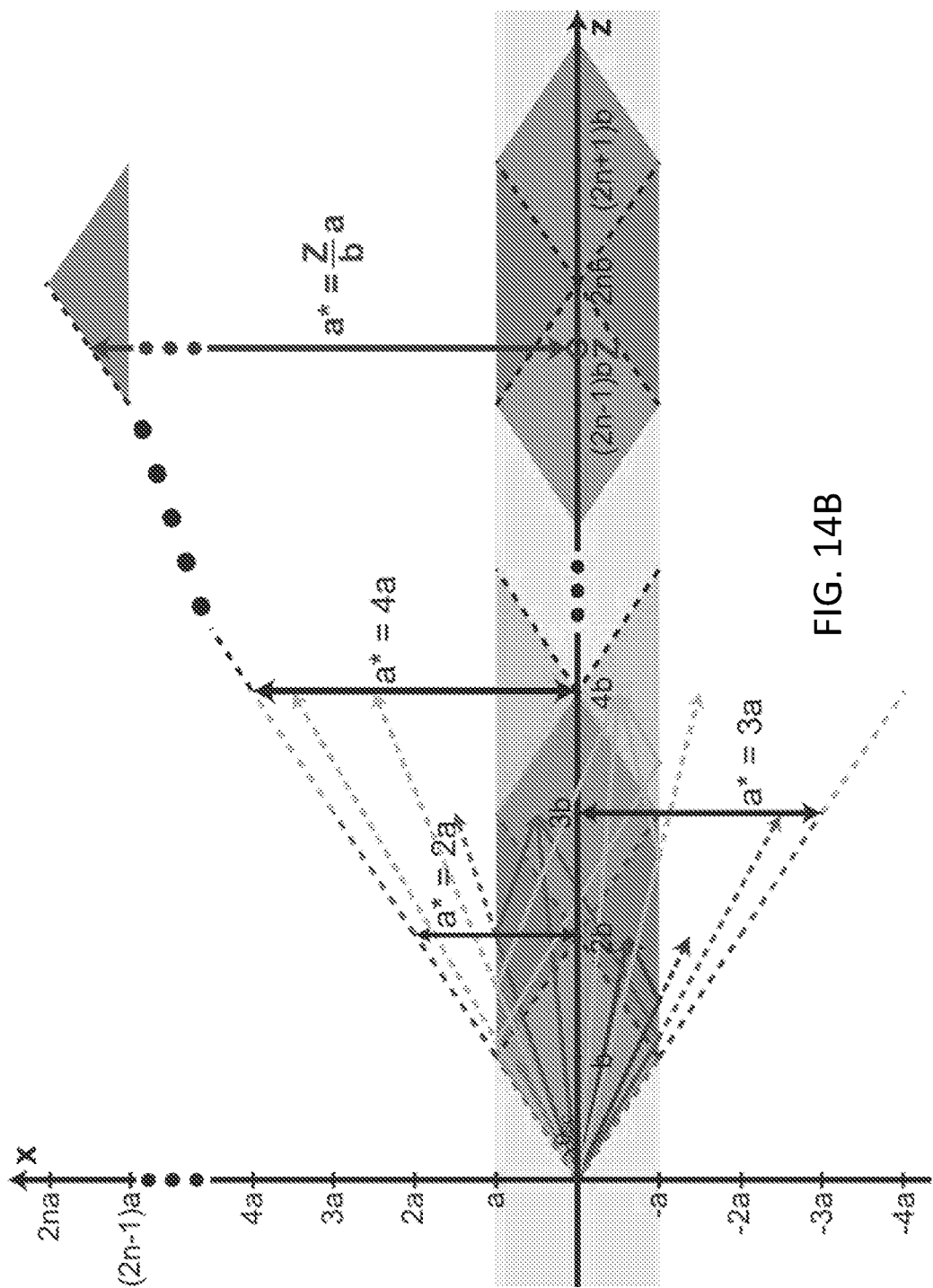
Figure 14C:
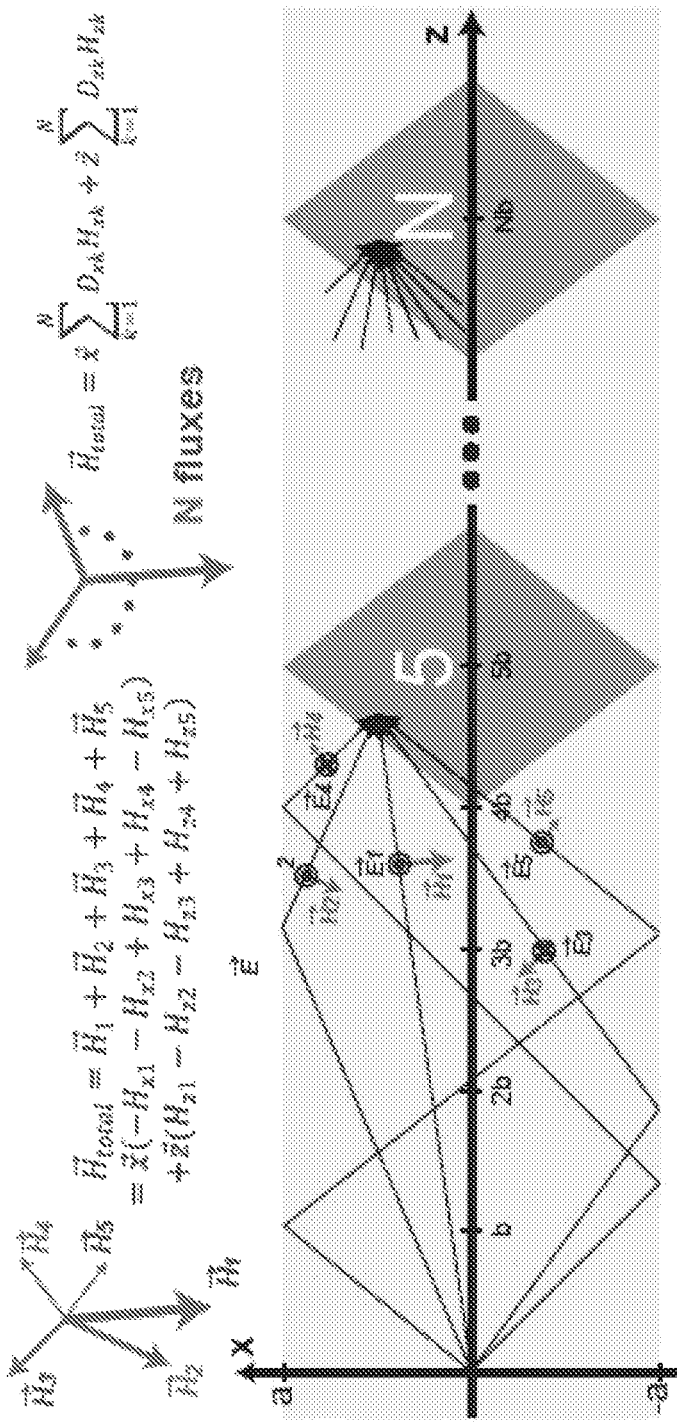

The total reflection at the human body's boundary helps the far-field propagation deliver the data signal further by holding the real EM wave power inside the biological tissues. It is necessary to make an analytical model of the magnetic flux density (B) averaged over the secondary coil dimension ($A_2=\pi\alpha^2$) placed at z=R to verify enhanced mutual inductance by this phenomenon. FIG. 14A illustrates how many EM wave fluxes can reach at one point inside the human arm by the total reflection while showing the number of arrived fluxes can increase with multiples of the unit length (b). This analytical induction can simply generalize that the number N of EM wave fluxes can arrive at a point on the inner area of the secondary coil placed at z=Nb. For the reasonable mathematical model with simplification, the increasing flux number by the total reflection can be represented with the extended effective radius ($\alpha^*=\alpha R/b$) of the secondary coil since the same total flux number can pass through the secondary as shown in FIG. 14B. However, the effective radius model excludes the changed H-field vector direction by the reflection at the boundary Therefore, it requires another notation of the direction to calculate the vector summation at the single point. FIG. 14C depicts the rotating of H-field vector direction according to increasing of the radiation angle ($\theta_s$). In the xz cross-section of the arm model, the H-field vector of perpendicularly polarized EM waves have only $\vec{x}$ and $\vec{z}$ vector components, and the inductive reasoning proves the signs of these vectors are rotating in the following order.

$$D_m = -1 \text{ (when } m = 4n-3 \text{ or } 4n-2)$$
$$= 1 \text{ (when } m = 4n-1 \text{ or } 4n)$$

$$D_{zm} = -1 \text{ (when } k = 4n-2 \text{ or } 4n-1)$$
$$= 1 \text{ (when } m = 4n-3 \text{ or } 4n)$$

where n is the natural number (n=1, 2, 3 ... ). When the far-field H-field generated by the primary coil is given as (9b), the averaged magnetic flux density passing through the secondary coil placed at z=R in the air can be derived as shown below On the other hand, the averaged magnetic field density with the cylindrical human arm model can be described as below.

$$|B_{z,far,avg}(R \approx Nb)| = \frac{|\Phi_{z,21}(R)|}{A_2} \quad (14a)$$

$$= \frac{1}{\pi a^2} \int_0^{2\pi} \int_0^{a^*} \mu_o |H_{far}(r)| \sin\theta \, da' \, d\phi$$

$$= \frac{\mu_o \epsilon_r k_o^2 I_o}{2} \left[ \int_0^a \frac{D_{z1}\sin^2\theta}{r} da' + \int_a^{2a} \frac{D_{z2}\sin^2\theta}{r} da' + \ldots + \int_{(N-1)a}^{Na} \frac{D_{zN}\sin^2\theta}{r} da' \right]$$

$$= \frac{\mu_o \epsilon_r k_o^2 I_o}{2} \sum_{m=1}^{N} D_{zm} \int_{(m-1)a}^{ma} \frac{\sin^2\theta}{r} da'$$

$$= \frac{\mu_o \epsilon_r k_o^2 I_o}{2} \sum_{m=1}^{N} D_{zm} \int_{(m-1)a}^{ma} \frac{a'^2}{\sqrt{R^2+a'^2}^3} da'$$

$$= \frac{\mu_o \epsilon_r k_o^2 I_o}{2} \sum_{m=1}^{N} D_{zm}$$

$$\left\{ \ln\left[\frac{ma + \sqrt{R^2+m^2a^2}}{(m-1)a + \sqrt{R^2+(m-1)^2a^2}}\right] - \frac{ma}{\sqrt{R^2+m^2a^2}} + \frac{(m-1)a}{\sqrt{R^2+(m-1)^2a^2}} \right\}$$

-continued $$|B_{x,far,avg}(R)| = \frac{1}{\pi a^2} \int_0^{2\pi} \int_0^{a^*} \mu_o |H_{far}(r)| \cos\theta \, da' \, d\phi \quad (14b)$$

$$= \frac{\mu_o \epsilon_r k_o^2 I_o}{2} \sum_{m=1}^{N} D_{zm} \int_{(m-1)a}^{ma} \frac{\sin\theta\cos\theta}{r} da'$$

$$= \frac{\mu_o \epsilon_r k_o^2 I_o}{2} \sum_{m=1}^{N} D_{zm} \int_{(m-1)a}^{ma} \frac{Ra'^2}{\sqrt{R^2+a'^2}^3} da'$$

$$= \frac{\mu_o \epsilon_r k_o^2 I_o}{2} \sum_{m=1}^{N} D_{zm}$$

$$\left[ \frac{(m-1)aR}{\sqrt{R^2+(m-1)^2a^2}} - \frac{maR}{\sqrt{R^2+m^2a^2}} \right]$$

$$|B_{far,avg}(R)| = \sqrt{|B_{x,far,avg}(R)|^2 + |B_{z,far,avg}(R)|^2} \quad (14c)$$

Figure 15:
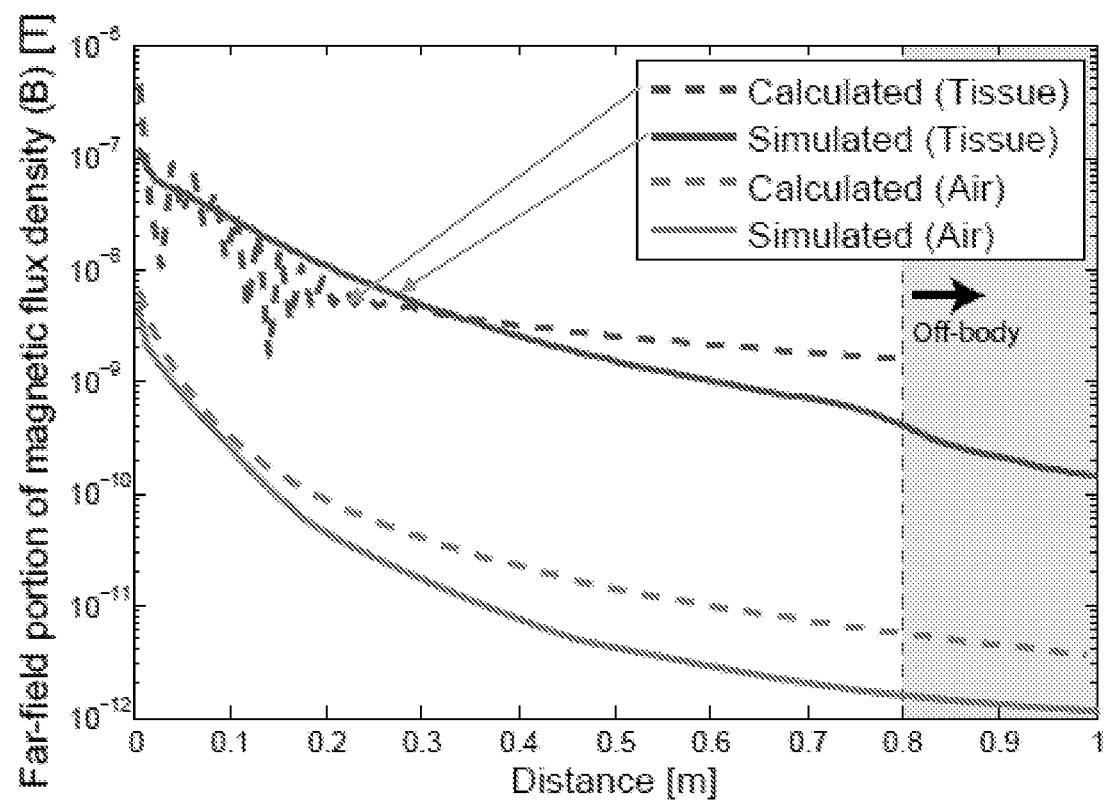
FIG. 15 plots data of the far-field portion magnet flux density enhanced by the body-air interface boundary condition.

FIG. 15 shows the far-field portion of $B_{averaged}$ simulated in HFSS and calculated in MATLAB with (14c) for the case when a is 5 cm, $I_o$ is 20 mA (for 1 mW of 5Ω coils), $\epsilon_r$ is 80, and the frequency is 21 MHz, comparing to the far-field portion of $B_{averaged}$ in the air described in (13). Although the arm model case results calculated with (13) or (14c) show the disagreement with simulations in the close distance from the source due to insufficient flux number caused by the assumption about the ideal magnetic dipole, the calculated curves still verify the improvement as well as the slowly falling of the far-field magnetic flux density. The total reflection by the human boundary was confirmed by simulating the radiation vector (real Poynting vector) in HFSS.

On the other hand, the near-field portion described in (8a) and (8b) is stored in the standing wave rather than radiated as the radiating wave. Also, since the E and H field are not coupled with each other in this portion, the boundary condition derived from the far-field radiating wave properties cannot be applied to this standing wave. Therefore, for the analysis of the near-field portion's behavior at the body-air interface, it is more suitable to employ the boundary condition for time harmonic EM fields given below $$\vec{x} \times \vec{E}_i = \vec{x} \times \vec{E}_t \quad (15a)$$

$$\vec{x} \cdot \epsilon \vec{E}_i = \vec{x} \cdot \epsilon_o \vec{E}_t \quad (15b)$$

$$\vec{x} \times \vec{H}_i = \vec{x} \times \vec{H}_t \quad (15c)$$

$$\vec{x} \cdot \mu_o \vec{H}_i - \vec{x} \cdot \mu_o \vec{H}_t = \vec{J}_s \approx 0 \quad (15d)$$

where $\vec{J}_s$ is the vector of the surface current density. Equation (15a) and (15c) imply that the tangential components ($\vec{y}$ and $\vec{z}$ components of E and H field) are continuous across the interface, but (15b) and (15d) indicate that both sides of the interface can have the difference of the normal component $\vec{x}$ from each other. However, since the E field in (8a) does not include the normal component and the surface current density) ($\vec{J}_s$) can be assumed as zero, the near-field portion of the EM field by the magnetic dipole does not show the discontinuity at the boundary. Therefore, the magnetic flux density can be calculated without the consideration on the boundary condition by the human body as shown below.

$$|B_{r,near,avg}(R)| = \frac{1}{\pi a^2}\int_0^{2\pi}\int_0^a \mu_o|H_{r,near}(r)|da'd\phi \quad (16a)$$

$$= \frac{\mu_o k^3 I_o}{2}\int_0^a \sqrt{\left(\frac{1}{kr}\right)^4 + \left(\frac{1}{kr}\right)^6} 2\cos\theta da'$$

$$= \mu_o k I_o \int_0^a \frac{R}{\sqrt{R^2+a'^2}^3}\sqrt{1+\frac{1}{k^2(R^2+a'^2)}}\, da'$$

$$|B_{\theta,near,avg}(R)| = \frac{\mu_o k^3 I_o}{2}\int_0^a \sqrt{\left(\frac{1}{kr}\right)^4 + \left(\frac{1}{kr}\right)^6} \sin\theta da' \quad (16b)$$

$$= \frac{\mu_o k I_o}{2}\int_0^a \frac{a'}{\sqrt{R^2+a'^2}^3}\sqrt{1+\frac{1}{k^2(R^2+a'^2)}}\, da'$$

$$|B_{near,avg}(R)| = \sqrt{|B_{r,near,avg}(R)|^2 + |B_{\theta,near,avg}(R)|^2} \quad (16c)$$

Figure 16:
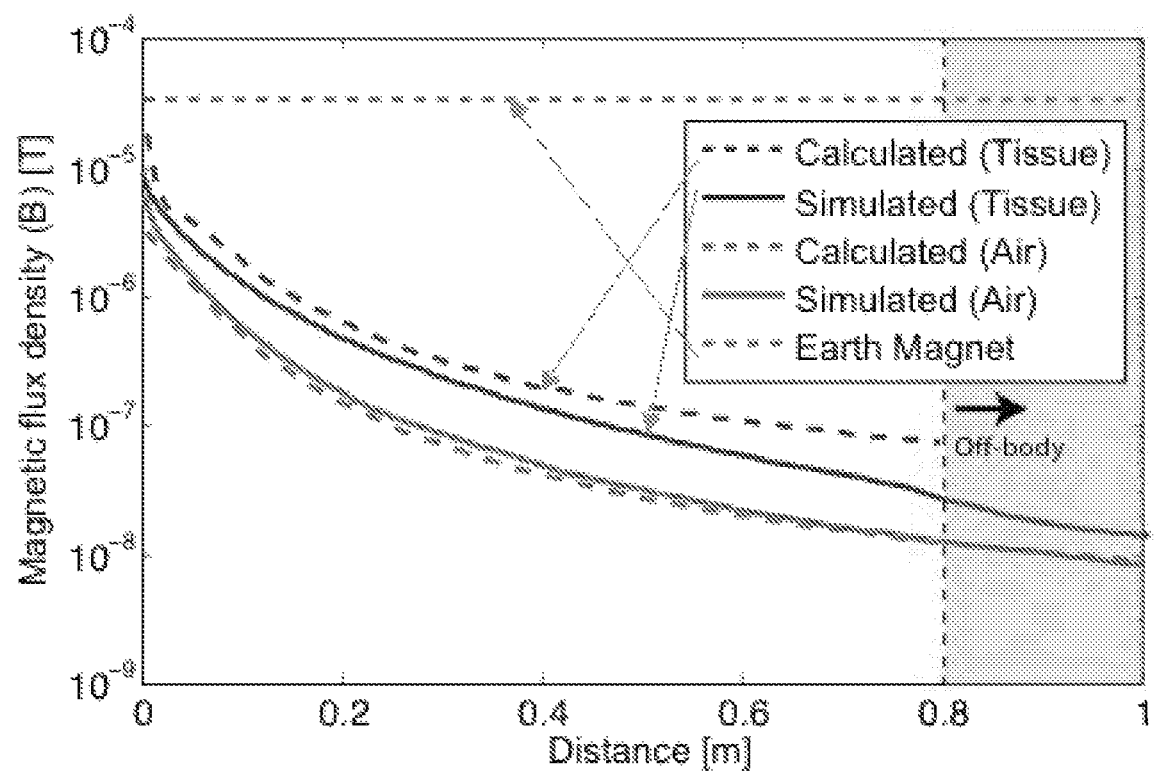
FIG. 16 illustrates total magnetic flux density merging the far-field and the near-field portion.

FIG. 16 shows the simulated and computed total magnetic flux density combining the far-field ((13) and (14c)) and near-field portion (16c). This result concludes that the boundary condition at the body surface induces the total reflection which helps the radiating power trapped in the human body while showing the steep diminished magnetic field density at the off-body where the total reflection does not happen.

The mathematical models therefore confirm the better path loss performance of the invention compared to eHBC that was also shown simulations and measurements. The mathematical models also provide guidance to artisans for adjusting system parameters to optimize preferred parameters, e.g., security, transmission power. For example, the modeling can be useful when estimating the maximum gain of mHBC using Eqn (6) and (7). As discussed above, the gain is decided by B averaged with given coil geometry (deciding the R, L and A) and the current (power budget of application).

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A body area network comprising:
a first coil configured to be worn on a body of a human, the first coil being configured and positioned to use a body leveraged magnetic field;
a transmitter to drive the first coil to generate the body leveraged magnetic field through the first coil, wherein the transmitter drives the first coil at a frequency selected such that the body leveraged magnetic field simultaneously includes near-field and far-field components and the far-field components are enhanced by a high dielectric constant of bodily tissue;
a second coil configured to receive a signal transmitted via the first coil to the second coil, the second coil being configured and positioned to receive both of the near- and far-field components; and
a receiver for receiving the signal transmitted to the second coil.

2. The body area network of claim 1, wherein the first coil is configured to wrap around a body portion of a human.

3. The body area network of claim 1, wherein the first coil is configured to be substantially parallel to a body portion of a human.

4. The body area network of claim 1, wherein the second coil is configured to be worn on a body portion of a human.

5. The body area network of claim 1, wherein the second coil is configured to be associated with a device that is off of the body.

6. The body area network of claim 1, wherein the first and second and first coils are tuned to couple via a ~1-100 MHz magnetic field.

7. The body area network of claim 1, wherein the first and second and first coils are tuned to couple via a ~20-50 MHz magnetic field.

8. The body area network of claim 1, wherein the first and second and first coils are tuned to couple via a ~10-30 MHz magnetic field.

9. The body area network of claim 1, wherein the first and second coils comprise single turn coils.

10. The body area network of claim 1, wherein the first and second coils comprise multi-turn coils.

11. The body area network of claim 1, wherein the transmitter drives the first coil to generate a magnetic field that resonantly or inductively couples to the second coil.

12. The body area network of claim 1, wherein the magnetic field is in the range of ~2-4 m around the human body.

13. The network of claim 1, wherein said first and second coils are conjugate matched with small capacitors.

14. A system including the body area network of claim 1, the system further comprising a body wearable sensor providing sensor data to the transmitter.

15. The system of claim 14, wherein said receiver is connected to an electronic device, which is part of a smart watch or smart phone.

16. A method for establishing magnetic far-field communications using the human body to enhance far-field magnetic flux density, the method comprising:
associating a transmitter coil with a portion of a human body, wherein the transmitter coil is configured to couple to a receiver coil in a frequency range that leverages frequency-dependent dielectric constants of biological tissues of the human body and thereby provide better physical far-field properties than air;
driving the transmitter coil to generate magnetic near- and far-field components that include the human body as a medium to propagate the magnetic near- and far-field components, wherein the driving is at a frequency and transmission power selected to enhance far-field magnetic flux density via guiding at a boundary of the human body; and
coupling the transmitter and receiver coils via the magnetic near- and far-fields.

17. The method of claim 16, wherein the first and second and first coils are tuned to resonantly couple via a ~1-100 MHz magnetic field, a ~20-50 MHz magnetic field, or a ~10-30 MHz magnetic field.

18. The method of claim 16, wherein said associating comprises wrapping the transmitter coil around a portion of the human body, or placing the transmitter coil in a plane substantially parallel to a portion of the human body.

19. The method of claim 16, wherein the receiver coil is associated with a portion of the human body.

20. The method of claim 16, wherein the receiver coil is associated with a device that is off the human body.

* * * * *